(12) United States Patent
Posseme

(10) Patent No.: US 9,773,674 B2
(45) Date of Patent: Sep. 26, 2017

(54) METHOD FOR FORMING PATTERNS BY IMPLANTING

(71) Applicant: Commissariat A L'Energie Atomique et aux Energies Alternatives, Paris (FR)

(72) Inventor: Nicolas Posseme, Sassenage (FR)

(73) Assignee: COMMISARIAT A L'ENERGIE ATOMIQUE AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/185,540

(22) Filed: Jun. 17, 2016

(65) Prior Publication Data

US 2016/0372325 A1 Dec. 22, 2016

(30) Foreign Application Priority Data

Jun. 19, 2015 (FR) ...................... 15 55664

(51) Int. Cl.
*H01L 21/033* (2006.01)
*H01L 21/306* (2006.01)
(Continued)

(52) U.S. Cl.
CPC .... *H01L 21/0337* (2013.01); *H01L 21/26533* (2013.01); *H01L 21/3086* (2013.01);
(Continued)

(58) Field of Classification Search
CPC .................................................. H01L 21/0337
See application file for complete search history.

(56) References Cited

U.S. PATENT DOCUMENTS

2014/0187046 A1 7/2014 Posseme et al.
2014/0273292 A1* 9/2014 Posseme ............. H01L 21/3065
438/5
(Continued)

FOREIGN PATENT DOCUMENTS

EP 2 750 170 A1 7/2014
EP 2 975 645 A1 1/2016

OTHER PUBLICATIONS

S. Wolf and R.N. Tauber, (Silicon Processing for the VLSI Era, vol. 1—Process Technology, Lattice Press, 1986)(pp. 542-557).*

(Continued)

*Primary Examiner* — Nadine Norton
*Assistant Examiner* — Mahmoud Dahimene
(74) *Attorney, Agent, or Firm* — Oblon, McClelland, Maier & Neustadt, L.L.P.

(57) ABSTRACT

A method of etching a layer including at least one pattern that has flanks is provided, including at least one step of modifying the layer by putting the layer in presence with a plasma into which $C_xH_y$ is introduced and which includes ions heavier than hydrogen; and wherein the plasma creates a bombardment of ions with a hydrogen base coming from the $C_xH_y$, the bombardment being anisotropic according to a main direction of implantation parallel to the flanks and so as to modify portions of the layer that are inclined with respect to the main direction and so as to retain unmodified portions on the flanks, wherein chemical species of the plasma form a carbon film on the flanks; and at least one step of removing the modified layer to be etched using a selective etching of modified portions of the layer with respect to the carbon film.

23 Claims, 9 Drawing Sheets

(51) Int. Cl.
    *H01L 21/308*     (2006.01)
    *H01L 21/311*     (2006.01)
    *H01L 21/3115*     (2006.01)
    *H01L 21/3213*     (2006.01)
    *H01L 21/265*     (2006.01)

(52) U.S. Cl.
    CPC .. *H01L 21/30604* (2013.01); *H01L 21/31111* (2013.01); *H01L 21/31116* (2013.01); *H01L 21/31144* (2013.01); *H01L 21/31155* (2013.01); *H01L 21/32134* (2013.01); *H01L 21/32135* (2013.01)

(56) References Cited

U.S. PATENT DOCUMENTS

2016/0020152 A1    1/2016    Posseme
2016/0035581 A1    2/2016    Posseme et al.

OTHER PUBLICATIONS

French Preliminary Search Report issued May 3, 2016 in French Application 15 55664, filed on Jun. 19, 2015 ( with English Translation of Categories of Cited documents and written opinion).

\* cited by examiner

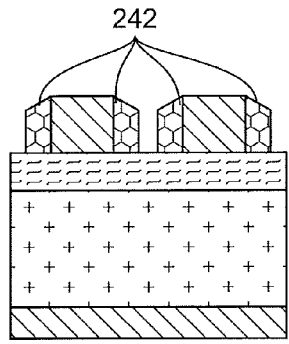
FIG. 2c
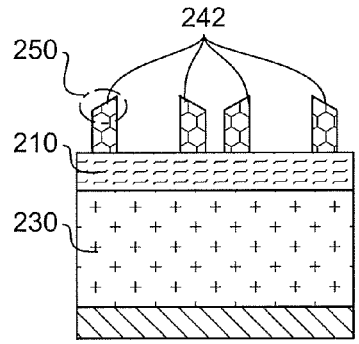
FIG. 2d
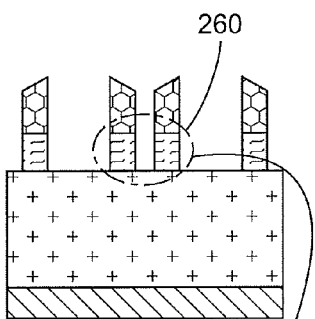
FIG. 2e
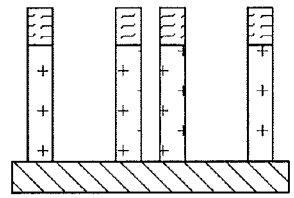
FIG. 2f
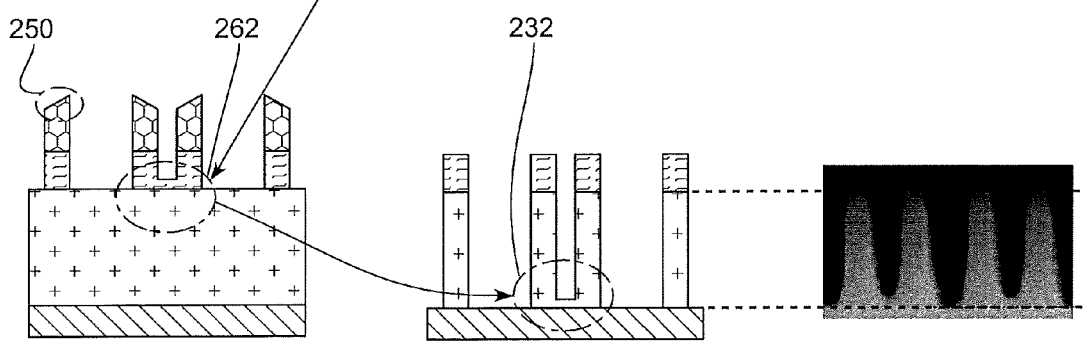
FIG. 2gFIG. 2hFIG. 2i

US 9,773,674 B2

METHOD FOR FORMING PATTERNS BY IMPLANTING

TECHNICAL FIELD OF THE INVENTION

This invention relates in general to the manufacture of all sorts of components produced by the microelectronics industry and related industries and more particularly the carrying out through etching of patterns with sizes that can be expressed in nanometers or nm, i.e.: $10^{-9}$ meter.

STATE OF THE ART

The relentless race for a reduction in the dimensions that characterizes the whole microelectronics industry could be achieved only with the constant improvement of key innovations throughout decades of development since the first integrated circuits (ICs) were produced industrially in the sixties.

Among the essential innovations that have made it possible for Moore's Law to continue to apply since the first integrated circuits were developed i.e.: a doubling observed in the density of the number of components every two years, the use of so-called "dry" etching techniques has greatly contributed to maintaining this growth until now. Dry etching primarily covers all of the techniques wherein, in a confined enclosure, a gaseous plasma is established that physically and chemically reacts with the surface of the wafer to be etched, giving the name "plasma etching" that is commonly used.

While the dimensions of transistors, which comprised almost all of the components of an IC, could still be expressed in microns ($10^{-6}$ meter) in the 80's, the dimensions that have to be able to be achieved now for carrying out the latest family of technological circuits or "nodes" are less than 20 nm. As such, pushed to their extreme limits, lithography and etching techniques have to handle increasingly difficult challenges in order to obtain patterns with such small dimensions.

In particular, obtaining such patterns in lithography comes up against many physical problems linked, among others, to the use of masks and to the wavelength of the light that must be to be used (extreme ultraviolet) for insulating photosensitive resins or, in the case where the insulation is carried out using an electron beam (e-beam), to the very low productivity of such methods where each pattern has to be insulated individually.

In order however to progress and to continue reducing the critical dimensions (CD) of the patterns to be carried out, recourse must be had to very sophisticated techniques that combine etching and photolithography.

As shown in FIG. 1, a first method, combining lithography and etching and intended to reduce the critical dimension of a pattern to be etched, first consists in defining via lithography, as shown in FIG. 1a, in a layer of resin 110, the minimum dimension that can be carried out in this way. Then, as shown in FIG. 1b, a trimming 112 is carried out on the resin patter using a first selective dry etching which makes it possible to achieve the critical size desired. It is then possible, as shown in FIG. 1c, to etch the critical size pattern 140 in the underlying layer 120, for example of the polycrystalline silicon typically constituting the gate of the transistors, which itself rests on an insulating layer 130, typically silicon oxide (SiO2). However, as shown in FIG. 1d, it is then frequent with the current techniques that, during the etching of the material of the layer 120, a "faceting" 150 is obtained of the etched pattern which is significantly different from the ideal shape sought: that of a rectangle in FIG. 1.

Another commonly used technique to overcome the limitations of conventional photolithography is known under the acronym SADP (self-aligned double patterning). In this technique, described very briefly hereinafter using the example of FIG. 2, patterns 222 are defined as hereinabove of the minimum size permitted by lithography in a layer 220 that will constitute a hard mask (HM). This is shown in FIG. 2a.

As shown in FIG. 2b, we then proceed with a conformal deposition, i.e. of an equal thickness regardless of the orientation of the surfaces, of a covering material or liner 240 that can be etched very anisotropically, as shown in FIG. 2c, in order to leave in place only the patterns 242 on the flanks of the patterns 222 that were defined beforehand. After removal of the material of the initial patterns 222, as shown in FIG. 2d, only the flank patterns 242 remain in place. Note here that a doubling of the number of patterns obtained is indeed obtained and that the latter are indeed self-aligned since they come from the same initial 222 defined beforehand by lithography.

As shown in FIG. 2e, the upper hard mask (HM2) 220 will then allow for the etching of another hard mask (HM1) 210 using the patterns 242, of a critical size and of a density greater than what was able to be carried out via lithography, as such making it possible to push back the inherent limits of integration with conventional lithography techniques that are able to be used in a production chain.

As shown in the example of FIG. 1, it is then possible to proceed with etching the underlying layer 230 made, for example, of polycrystalline silicon resting on an insulating layer 270. Ideally, the result would be the one shown in FIG. 2f.

However, as in the example in FIG. 1, a faceting 250 of the patterns 242 of the upper hard mask also generally occurs. In addition, for patterns of increasingly smaller dimensions undesirable effects appear during their plasma etching. Indeed, a strong influence is observed in the density of patterns to be etched on the speed and the conditions of etching. Known as "microloading", an example of this phenomenon is shown in FIG. 2g. In the zones with a stronger density in patterns 242, as for example the zone 260 of FIG. 2e, the result of the etching of the hard mask 210 can be in practice often the one shown in FIG. 2g showing an incomplete etching 262 of the zones with a higher density of patterns. Which also translates, as shown in FIG. 2h, in an incomplete etching of the active layer 230. FIG. 2i also shows using a photo taken with the scanning electron microscope (SEM) on a cross-section of a device carries out with the SADP technique the undesirable effects of the faceting and of the microloading on the conformity of the etching obtained with respect to what is desired, i.e. the profile shown in FIG. 2f.

FIG. 3 also shows the limitations of the use of conventional plasma etching for the carrying out of SADP patterns. Note in particular in FIG. 3a which is, like FIG. 2i, a cross-section view carried out with a SEM of a device carried out with the SADP technique, with the various profiles and over-etching 310 of the underlying layer obtained according to whether the etching is done between the flank patterns or outside of the latter. Indeed, as shown in FIG. 3b, the non-symmetrical faceting 340 of the flank patterns obtained during the carrying out of the hard mask leads to the obtaining of different opening angles, 320 and 330, for the collection of species of the etching plasma that, as already discussed hereinabove, results in etching speeds profiles different from the functional layer according to the density of the SADP patterns made in the hard mask.

There is therefore a need consisting in proposing a solution for obtaining patterns of small dimensions while still reducing and even suppressing at least some of the disadvantages of the known techniques mentioned hereinabove.

Other objects, characteristics and advantages of the present invention will become apparent upon examining the following description and the appended drawings. It should be understood that other advantages can be incorporated herein.

SUMMARY OF THE INVENTION

This invention relates to a method of etching a layer to be etched comprising at least one pattern that has flanks. The method comprises:

at least one step of modifying the layer to be etched by putting the layer to be etched into presence with a plasma into which CxHy has been introduced where x is the proportion of carbon and y is the proportion of hydrogen (H) and comprising ions that are heavier than hydrogen; the conditions of the plasma, in particular the concentration in CxHy, the energy of the ions and the main direction of implantation being chosen in such a way that:

the plasma creates a bombardment of ions with a hydrogen base (H, $H^+$, $H_2^+$, $H_3^+$ etc.) coming from the CxHy, with the bombardment being anisotropic according to a main direction of implantation parallel to said flanks and in such a way as to modify portions of the layer to be etched that are inclined with respect to said main direction of implantation and in such a way as to retain unmodified portions of the layer to be etched covering said flanks, chemical species of the plasma containing carbon coming from the CxHy forming a carbon film in particular on surfaces parallel to said main direction of implantation;

the plasma creates a bombardment of ions that are heavier than hydrogen which prevents said chemical species of the plasma containing carbon and coming from the CxHy from forming a carbon film on the surfaces of the layer to be etched that are inclined with respect to said main direction of implantation, in particular those that are perpendicular to the main direction of implantation.

The method comprises at least one step of removing the modified layer to be etched using a selective etching of the modified portions of the layer to be etched with respect to the carbon film.

As such, the invention proposes a method that overcomes at least partially the disadvantages of the plasma etching described hereinabove in particular in the case of application of this technique of dry etching in carrying out SADP patterns. In particular, applied to the etching of SADP patterns, the invention makes it possible to obtain patterns that very strongly approach the ideal shapes shown in FIG. 2f, i.e. without faceting and with a uniform etching of the critical dimensions.

The invention is not limited in the obtaining of patterns of the SADP type.

Applied to other fields of application, the invention makes it possible to obtain a very high aspect ratio while still retaining very good dimensional control of the width of the initial pattern and of the verticality of the flanks of the pattern.

This is in particular made possible by the synergy between the step of modifying by a plasma comprising species that in particular ensure the functions of modifying the layer to be etched and of protecting the flanks and the step of selective etching.

The invention as such makes it possible to improve the precision of the manufacture of the patterns via a reliable, simple and very precise method.

According to an advantageous embodiment, the step of removing the modified layer to be etched is carried out in such a way as to be selective of the modified portions of the layer to be etched with respect to the unmodified portions of the layer to be etched.

The step of modifying is carded out in such a way that the plasma provokes an anisotropic bombardment of ions with a hydrogen base coming from the CxHy according to a main direction of implantation parallel to the flanks of the motive and in such a way as to form a modified layer to be etched by modifying portions of the layer to be etched located outside of the flanks in such a way as to retain unmodified portions, or at the very least unmodified over all of their thickness, of the layer to be etched covering the flanks of the pattern.

Ions with a hydrogen base are preferably taken from: H, $H^+$, $H_2^+$, $H_3^+$.

A carbon film is a film comprising chemical species containing carbon. According to a non-limiting embodiment the carbon film is made of carbon.

Very advantageously, the carbon film contributes to protecting the unmodified layer to be etched on the flanks during the etching of the modified portions of the layer to be etched by HF for example.

Advantageously, the carbon film can contribute to protecting the flanks of the pattern during the bombardment by preventing the hydrogen or heavy ions from modifying the layer to be etched or from modifying it across its entire thickness.

The step of modifying is carried out in such a way as to form a carbon film in particular on surfaces parallel to the main direction of implantation also designated as direction of bombardment or favored direction of bombardment.

The method also comprises at least one step of removing modified portions of the layer to be etched using a selective etching of the modified portions of the layer to be etched with respect to said carbon film and with respect to unmodified portions of the layer to be etched.

Particularly advantageously, it was observed that the bombardment with ions heavier than hydrogen such as He allows the chemical species of the plasma containing carbon coming from the CxHy to form a protective film of carbon (carbon film) in particular on the surfaces parallel to the direction of the bombardment and while preventing moreover these chemical species containing carbon from forming a carbon film on the surfaces of the layer to be etched which are perpendicular to the direction of the bombardment.

The bombardment with ions heavier than hydrogen destroys the carbon film that would tend to be deposited on the surfaces perpendicular to the direction of the bombardment.

During the step of removing, this etching etches the surfaces of the modified portions of the layer to be etches that are not covered with the carbon film.

As such, it is possible to protect a structure on which the carbon film is formed.

Particularly advantageously, the modification of the layer to be etched by bombardment of hydrogen ions (H) results in implanting these ions with a hydrogen base in the targeted layers. This modification by implantation of ions makes it possible to substantially improve the selectivity of the etching of this layer with respect to the material of the underlying layer, to the layer to be etched for example of the silicon. This implantation also makes the thickness of the modified layer to be etched faster than that of the unmodified layer to be etched.

The etching as such consumes the modified portions of the layer to be etched preferably on the underlying layer and unmodified portions of the layer to be etched. As such, the risk of excessive consumption of the surface layer of material of the underlying layer is reduced and even eliminated.

Preferably, the modification of the layer to be etched retains a partial or complete thickness of the unmodified layer to be etched on the flanks of the pattern. This thickness is retained, at least partially, during the selective etching.

Moreover, the carbon film contributes to protecting the unmodified layer to be etched on the flanks during the etching of the modified portions of the layer to be etched.

The implantation carried out by a plasma comprising said ions with a hydrogen base has for advantage to enable a continuous implantation into a volume extending from the surface of the implanted layer.

Besides, using plasma enables an implantation at lower depths than the minimum depths which can be obtained with implanters. Thus, an implantation with plasma makes it possible to efficiently and relatively homogeneously or at least continuously implant thin thicknesses which can then be removed with a selective etching. Such continuous implantation from the implanted face makes it possible to enhance the homogeneity of the modification according to the depth, which leads to a time-constant speed of etching of the implanted layer. Besides, the increase in the selectivity conferred by the implantation as compared to other layers is effective as soon as etching of the implanted layer is started. Plasma implantation also enables a significantly enhanced control of etching accuracy.

The plasma implantation typically makes it possible to implant then to remove thicknesses extending from the surface of the implanted layer and on a depth ranging from 0 nm to 100 nm. Conventional implanters, enable an implantation in a volume ranging from 30 nm to several hundreds of nanometers. However, conventional implanters do not make it possible to implant the species between the surface of the layer to be implanted and a depth of 30 nm. When developing the present invention, it has been noted that the implanters do not make it possible to obtain a sufficiently constant speed of etching of the modified portions of the layer to be etched and this from the surface of the latter, thus leading to less etching accuracy compared to what the invention enables.

Using plasma to modify the portion to be removed is thus particularly advantageous within the scope of the invention which aims at removing a thin thickness of the layer to be etched, typically between 1 and 10 nm and more generally between 1 and 30 nm.

The step of modification carried out using a plasma modifies the layer to be etched continuously from the surface of the layer to be etched and over a thickness between 1 nm and 30 nm and preferably between 1 nm and 10 nm.

Also advantageously, the modification of the layer to be etched by implantation of ions with a hydrogen base also makes it possible to improve the selectivity of this modified layer to be etched with respect to the underlying layer.

As such, during the step of modifying the conditions of the plasma, in particular the concentration in CxHy, the energy of the ions and the main direction of implantation are chosen in such a way that:

the plasma creates a bombardment of ions with a hydrogen base (H) coming from the anisotropic CxHy according to a main direction of implantation parallel to the flanks of the motive and in such a way as to modify portions of the layer to be etched located outside of the flanks of the pattern while retaining unmodified portions, or at the very least unmodified over all of their thickness, of the layer to be etched covering the flanks of the pattern.

chemical species of the plasma containing carbon coming from the CxHy forming a carbon film in particular on surfaces parallel to the main direction of implantation;

the plasma creates a bombardment of ions that are heavier than hydrogen which prevents the chemical species containing carbon coming from the CxHy from forming a carbon film in particular on the surfaces of the layer to be etched that are perpendicular to the main direction of implantation.

Hereinafter are announced optional characteristics that can possibly be used combined together or alternatively with the characteristics hereinabove:

The bombardment of ions heavier than hydrogen (designated in what follows as "heavy ions"), in particular its energy, its direction and its fluence are designed in such a way that the carbon film is formed on the surfaces parallel to the direction of implantation and in such a way that the carbon film does not form on the surfaces of the layer to be etched which are perpendicular to the direction of implantation. More precisely, the ionic bombardment consumes, very anisotropically, the chemical species containing carbon which are deposited at the bottom of the structures. The bombardment according to a direction perpendicular to the direction of implantation (i.e. on the level of the flanks) is very low. The energy of the ions is therefore not sufficient for preventing the formation of this carbon film.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIG. 5, comprised

FIG. 6, comprised

FIG. 7, comprised

Figure 1A:
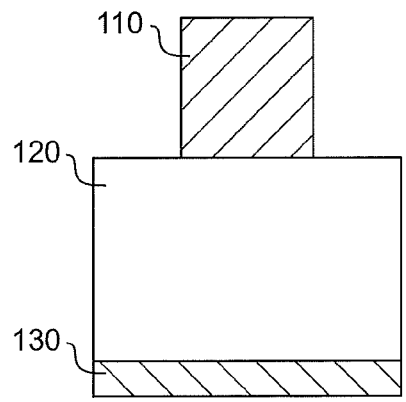
FIG. 1, comprised of FIGS. 1a to 1d, shows a first technique of prior art for achieving the critical dimension (CD) of a pattern to be etched.
Figure 1B:
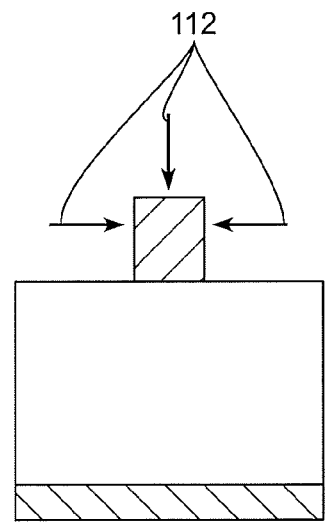
Figure 1C:
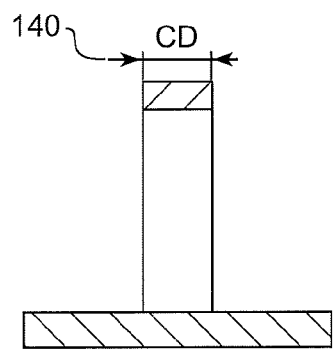
Figure 1D:
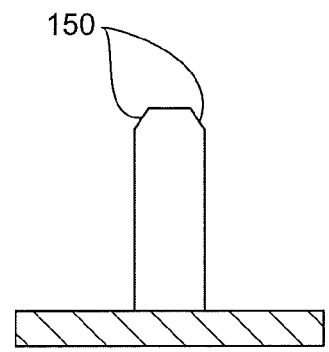
Figure 2A:
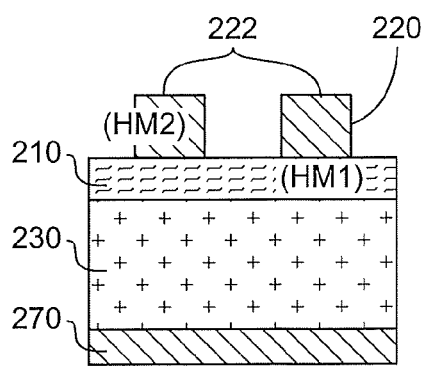
FIG. 2, comprised of FIGS. 2a to 2i, shows a second technique of etching of prior art referred to as SADP which makes it possible to double of the density of the patterns that it is possible to obtain using a conventional lithography.
Figure 2B:
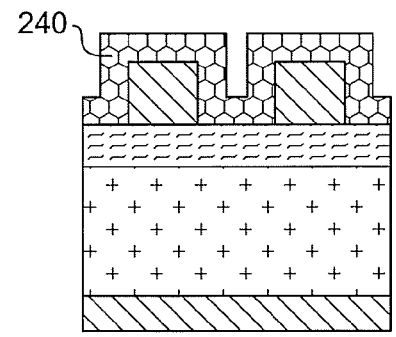
Figure 3A:
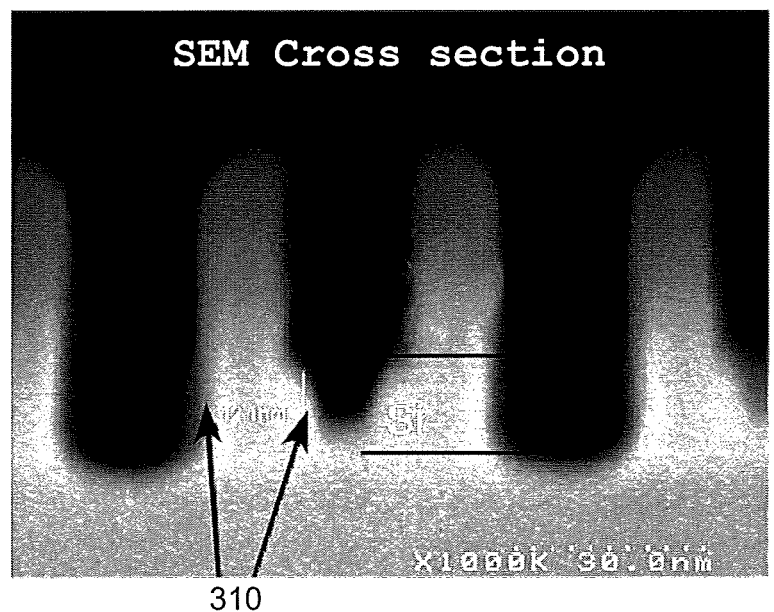
FIG. 3, comprised of FIGS. 3a and 3b, shows disadvantages linked to the plasma etching, in a functional layer, of patterns obtained beforehand by the SADP technique in a hard mask.
Figure 3B:
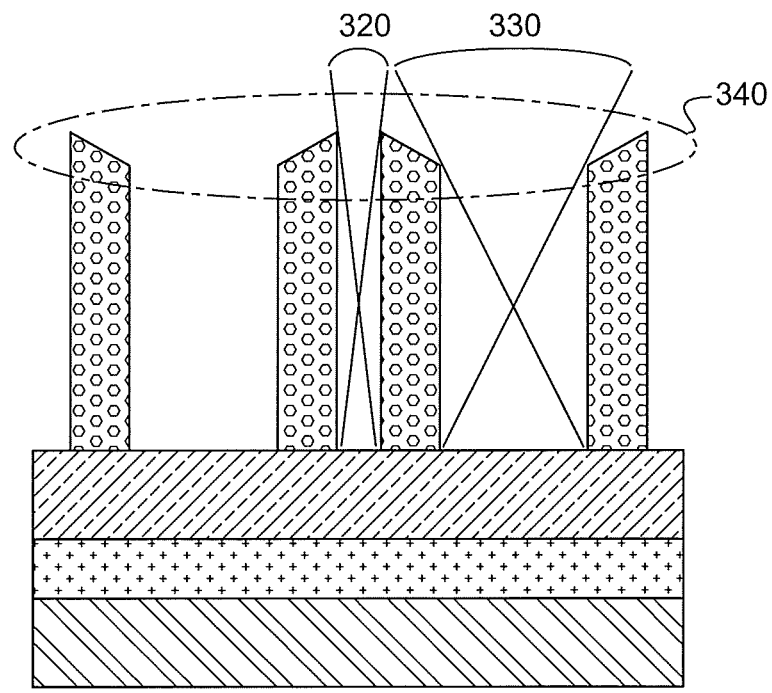

The drawings attached are given as examples and are not limiting to the invention.

DETAILED DESCRIPTION OF THE INVENTION

It should be noted that, within the scope of the present invention, the words "on", "over", "cover" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate on which the lower layer has been deposited. Thickness is thus generally measured along a vertical direction in the figures shown. On the contrary, the thickness of a layer covering a flank of a pattern is measured along a direction perpendicular to such flank.

Conventionally, the dielectric constant of a layer can be measured by example according to the so-called mercury drop method.

Recall that according to an aspect this invention relates to a method of etching a layer to be etched comprising at least one pattern that has flanks. The method comprises:
at least one step of modifying the layer to be etched by putting the layer to be etched into presence with a plasma into which CxHy has been introduced where x is the proportion of carbon and y is the proportion of hydrogen (H) and comprising ions that are heavier than hydrogen; the conditions of the plasma, in particular the concentration in CxHy, the energy of the ions and the main direction of implantation being chosen in such a way that:
the plasma creates a bombardment of ions with a hydrogen base (H, $H^+$, $H_2^+$, $H_3^+$ etc.) coming from the CxHy, with the bombardment being anisotropic according to a favored direction parallel to said flanks and in such a way as to form a modified layer to be etched by modifying portions of the layer to be etched that are inclined with respect to said favored direction and in such a way as to retain unmodified portions of the layer to be etched covering said flanks,
chemical species of the plasma containing carbon coming from the CxHy forming a carbon film in particular on surfaces parallel to said favored direction of bombardment;
the plasma creates a bombardment of ions that are heavier than hydrogen which prevents said chemical species of the plasma containing carbon and coming from the CxHy from forming a carbon film on the surfaces of the layer to be etched that are inclined with respect to said favored direction, in particular those that are perpendicular to the direction of bombardment.

The method comprises at least one step of removing the modified layer to be etched using a selective etching of the modified portions of the layer to be etched with respect to the carbon film.

Before beginning a detailed review of the embodiments of the invention, hereinafter are announced optional characteristics that can possible be used in combination or alternatively: During said step of modifying the layer to be etched, the flow rate of CxHy in the plasma is between 2% and 50% of the total flow rate and preferably between 8% and 40%. Beyond this, it will be in deposition mode. The dilution will depend on the choice of the species of the plasma, He, N2, Ar or O2 etc. For example:
for He or Ar the flow rate of the CxHy has to be less than 10% of the total flow rate;
for N2 the flow rate of the CxHy has to be less than 20% of the total flow rate;
for O2 the flow rate of the CxHy has to be less than 50% of the total flow rate.

During the step of modifying the layer to be etched, the concentration in ions heavier than hydrogen in the plasma is between 50% and 98%.

Advantageously these concentrations make it possible to ensure an effective modification of the layer to be etched by the ions with a hydrogen base while still allowing for the formation of a carbon film that protects the flanks of the pattern. These concentrations also allow the ions heavier than hydrogen to prevent the formation of the carbon film that would tend to be deposited on all of the surfaces. Moreover, these concentrations make it possible to effectively dissociate the molecule CxHy in order to release the species H.

Advantageously, the CxHy is CH4.

The ions heavier than hydrogen of the plasma, taken from argon (Ar), helium (He), nitrogen (N2), xenon (Xe) and oxygen (O2), can be used alternatively or in combination in the same plasma. Their role is to prevent the formation of the carbon film in the bottom of the pattern. Other ions can be suitable.

Ions with a hydrogen base are preferably taken from: H, $H^+$, $H_2^+$, $H_3^+$.

Other optional characteristics of the invention, that can be implemented in a combined manner according to all of the combinations or alternatively, are indicated hereinafter:
According to an embodiment, the at least one pattern is a protruding patter that has at least one top.
According to an embodiment, the method comprises, prior to the step of modifying:
a step of carrying out protruding reliefs and that have flanks parallel to said favored direction of implantation; the flanks each extend from an underlying layer in relief and to the top;
a step of forming the layer to be etched via deposition, preferably by conformal deposition, on said reliefs. According to an embodiment, this step of forming is carried out in such a way that the layer to be etched covers the top of the reliefs and a zone located between two reliefs.
According to an embodiment, the step of carrying out protruding reliefs is carried out in such a way that at least some of the reliefs have a top and are delimited by two flanks extending on either side of the top and each extending from an underlying layer to the relief and to the top.

According to an embodiment, this step of forming is carried out in such a way that the layer to be etched covers the top of the reliefs and a zone located between two reliefs.

According to an embodiment, the step of modifying is carried out in such a way as to modify the layer to be etched over its entire thickness on the top of the reliefs and in the zone located between two reliefs and the step of removing is carried out in such a way as to remove all of the modified portions of the layer to be etched as such exposing the top of the reliefs.

As such, after the step of removing, only the portions of the layer to be etched located on the flanks of the reliefs is retained.

According to an embodiment, the method comprises, after the step of removing a step of etching of the reliefs selectively to the unmodified portions of the layer to be etched.

Preferably, the step of etching of the reliefs is selective with respect to the underlying layer on which the reliefs rest.

As such, for each relief, two patterns are obtained formed by the layer to be etched.

According to another embodiment with protruding pattern, the method comprises, prior to the step of modifying, a step of forming a mask covering at least the top of the layer to be etched and leaving exposed the layer to be etched on either side of the pattern. During the step of modifying only the portions of the layer to be etched located on either side of the patter are modified.

This makes it possible to increase the height of the pattern with respect to the layer to be etched located on either side of the patter, without however widening the pattern and while retaining the geometry of the flanks.

According to another embodiment, the at least one pattern is a pattern in hollow that has at least one bottom and walls forming the flanks.

According to an embodiment, the method comprises, prior to the step of modifying, a step of forming a mask covering the layer to be etched at least partially outside of the pattern and leaving the bottom of the patter exposed. During the step of modifying only the portions of the layer to be etched located in the bottom of the patter are modified.

This makes it possible to increase the depth of the pattern in the hollowed, without however widening the pattern and while retaining the geometry of the flanks.

According to these embodiments, the flanks of the pattern are vertical. They are parallel to the favored direction of implantation.

Advantageously, the layer to be etched is a porous layer. In the framework of this invention, the term porous layer designates a layer of which the presence of a vacuum in the film is greater than 5% and preferably between 5 and 10%.

Advantageously, the layer to be etched is a non-porous layer.

Advantageously, the step of forming the layer to be etched comprises a step of depositing the layer to be etched during which the polarizability of the layer to be etched is reduced in such a way as to reduce the dielectric constant of this layer. According to a favored embodiment, bonds that are less polar than the bonds forming the base material of the layer to be etched are used for this.

The step of forming the layer to be etched comprises a step of depositing the layer to be etched during which is carried out following a step of reducing the dielectric constant of the layer to be etched. The step of reducing the dielectric constant of the layer to be etched comprises the introduction of a porosity in the layer to be etched. Alternatively or combined with the introduction of a porosity, the step of forming the layer to be etched comprises the introduction of precursors into the layer to be etched in the process of depositing. If the layer to be etched is a layer with a silicon nitride base, then the precursors are for example chosen in such a way as to form bonds that are less polar that the silicon nitride, such as Si—F, SiOF, Si—O, C—C, C—H, and Si—CH3.

According to an embodiment, the implantation parameters, in particular the energy communicated to the ions, the duration and the dose of implantation as well as the nature of the ions are provided in such a way that the modified portions of the layer to be etched can be selectively etched with respect to the carbon film. These parameters are also configured in such a way that the modified portions of the layer to be etched can be selectively etched with respect to the unmodified portions of the layer to be etched. These parameters are also configured in such a way that the modified portions of the layer to be etched can be selectively etched with respect to the underlying layer of the layer to be etched.

Advantageously, the step of modifying is carried out in such a way that the plasma generates a bombardment of the ions heavier than hydrogen anisotropically according to a favored direction parallel to the flanks of the pattern in such a way as to prevent the carbon coming from the CxHy from forming a carbon film on the surfaces perpendicular to the flanks of the pattern.

Advantageously, the step of modifying is carried out in such a way that the ions heavier than hydrogen of the plasma dissociate the molecule of the CxHy in such a way as to allow the ions with a hydrogen base coming from the CxHy to be implanted in said portions of the layer to be etched. As such, the ions with a hydrogen base coming from the molecule CxHy are dissociated by the heavy ions of the plasma. It was shown that helium (He) is particularly effective in obtaining this dissociation of the CxHy. The mixture as such comprises a CxHy/He mixture.

Advantageously, the step of removing modified portions of the layer to be etched is carried out by etching selectively to an underlying layer to the layer to be etched and on which the latter rests directly.

According to an embodiment, the layer to be etched rests directly, at least partially, on an underlying layer and during the step of modifying, the conditions of the plasma, in particular the concentration in CxHy, the energy of the ions and the main direction of implantation are chosen in such a way that, on the surfaces perpendicular to the direction of implantation, the entire thickness of the layer to be etched is modified by the implantation of the ions with a hydrogen base. The step of removing is carried out in such a way as to remove all of the modified portions of the layer to be etched, this exposing the underlying layer on the surfaces perpendicular to the direction of implantation.

Advantageously, the step of modifying is carried out in such a way as to modify only an upper portion of the thickness of the layer to be etched on the flanks of the pattern by retaining an unmodified thickness of the layer to be etched on the flanks of the pattern.

Alternatively, the step of removing is carried out by selective dry-etching of said modified layer to be etched with respect to said carbon film, with respect to unmodified portions of the layer to be etched and with respect to an underlying layer. Furthermore the dry etching does not also take a hard mask defining the pattern.

According to an embodiment, the layer to be etched rests directly, at least partially, on an underlying layer and the step of removing modified portions of the layer to be etched is carried out by etching selectively to the underlying layer.

According to an embodiment, the step of removing is carried out by selective dry-etching of modified portions of the layer to be etched with respect to said carbon film, with respect to unmodified portions of the layer to be etched and with respect to an underlying layer on which the layer to be etched rests.

Preferably, the material of the underlying layer is silicon, and the step of removing modified portions of the layer to be etched is carried out by selective dry-etching with silicon (Si).

Preferentially, the dry etching is carried out in a plasma formed in a confined enclosure using nitrogen trifluoride (NF3) and ammonia (NH3).

According to a particularly advantageous embodiment, the implantation and the removal of the layer to be etched are carried out in the same plasma reactor. A modification of the layer to be removed carried out by an implantation by plasma as such makes it possible to carry out the modification of the layer and the etching in the same chamber which is very advantageous in terms of simplification, time and cost of the method.

Advantageously, the dry etching comprises: a step of etching consisting in the forming of solid salts; and a step of sublimation of the solid species. This embodiment makes it possible to obtain very good selectivity of the etching of the modified portions of the layer to be etched with respect to the unmodified portions. In particular, this selectivity of the etching is much higher (typically by a factor of 10 at least) to that obtained with an HF solution.

In a preferred but not limiting manner, the method comprises several sequences each comprising a step of modifying and a step of removing, and during at least one of the steps of modifying, only a portion of the thickness of the layer to be etched is modified.

The sequences are preferably repeated until disappearance of the modified portions of the layer to be etched on all of the surfaces parallel to the plane of a substrate on which the layer to be etched rests.

In an embodiment, the step of modifying is a single step carried out in such a way as to modify the layer to be etched in all of its thickness over all of the surfaces parallel to the plane of a substrate on which the layer to be etched rests and to not modify the layer to be etched in all of its thickness on the surfaces perpendicular to this plane. This embodiment allows for particular precise control of the dimension of the patterns.

In a preferred but not limiting manner, the step of modifying is preceded by a step of anisotropic etching that is carried out in a of the CH3F/O2/He type. This embodiment makes it possible to remove a lot of the layer to be etched in one step then to refine the control of the thickness on the flanks during a second step. This embodiment as such makes it possible to reduce manufacturing time.

The step of removing is carried out via etching of modified portions of the layer to be etched selectively to the carbon film.

The material of the underlying layer to the layer to be etched is taken from: silicon (Si), germanium (Ge), silicon-germanium (SiGe).

The step of modification carried out using a plasma modifies the layer to be etched continuously from the surface of the layer to be etched and over a thickness between 1 nm and 30 nm and preferably between 1 nm and 10 nm.

According to an embodiment, the layer to be etched is a layer with a nitride (N) base and/or with a silicon (Si) base and/or with a carbon (C) base.

Advantageously, the layer to be etched has a dielectric constant less than or equal to 8 and preferably less than or equal to 7.

In an embodiment, the layer to be etched is preferentially a layer with a nitride base such as a layer of silicon nitride.

In another embodiment, the layer to be etched has or comprises a material that has a dielectric constant less than 4 and preferably less than 3.1 and preferably less than or equal to 2, which as such makes it possible to reduce the parasite capacity in order to possibly improve the performance of the transistor. For example, the material of the layer to be etched is preferably taken from: SiCO, SiC, SiCN, SiOCN, SiCBN, SiCO, SiOCH, cBN (cubic boron nitride) and SiO2. This makes it possible to reduce the parasite capacity and consequently to improve the performance of the transistor.

According to an embodiment, the layer to be etched is not a layer of silicon nitride (SiN or Si3N4) that covers a transistor gate and that is intended to form transistor gate spacers.

According to an embodiment, the step of removing modified portions of the layer to be etched is preferably carried out by selective wet-etching with carbon, at the unmodified portions of the layer to be etched, and/or with said material of the underlying layer. In this case, the modified portions of the layer to be etched is consumed very easily with respect to the consumption of the carbon, of the material of the underlying layer (typically silicon) and/or of the silicon oxide (SiO2).

According to another embodiment, the layer to be etched rests directly, at least partially, on an underlying layer with a silicon base and the selective etching of the step of removing is selective with respect to the silicon and is obtained using a solution with a hydrofluoric acid (HF) base.

In an embodiment where the layer to be etched is a layer with a nitride base, the solutions provide indeed an etching solution with a hydrofluoric acid (HF) base that consumes the nitride at a speed of 0.5 nm/minute and with a selectivity of the nitride with respect to the silicon of about 20 to 30.

In addition, the selectivity of the modified nitride with respect to the carbon and the unmodified nitride is respectively greater than 100 and 30.

This therefore makes it possible to substantially improve the selectivity and therefore the precision of the etching.

According to an embodiment where the layer to be etched rests directly, at least partially, on an underlying layer with a silicon base and the layer to be etched has a nitride base the selective etching of the step of removing is selective with respect to the silicon and is obtained using a solution with a H3PO4 base.

According to an embodiment, the layer to be etched is made of a material with a material with a semi-conductor base comprising: silicon (Si), germanium (Ge), silicon germanium (SiGe).

According to an embodiment, the layer to be etched is made of a composite semi-conductor material of the III-V and II-VI type obtained by combining, respectively, two elements, or more, of columns II and III on the one hand, and V and VI on the other hand, of the periodic table of the elements.

According to an embodiment, the layer to be etched is an oxide or a nitride of said semi-conductor material.

According to an embodiment, the layer to be etched is a metal oxide or boron-doped carbon (B:C).

According to an embodiment, the layer to be etched is metal or a metal alloy.

Several examples of embodiments of the invention shall now be described in reference to FIGS. 4 to 9.

Figure 4:
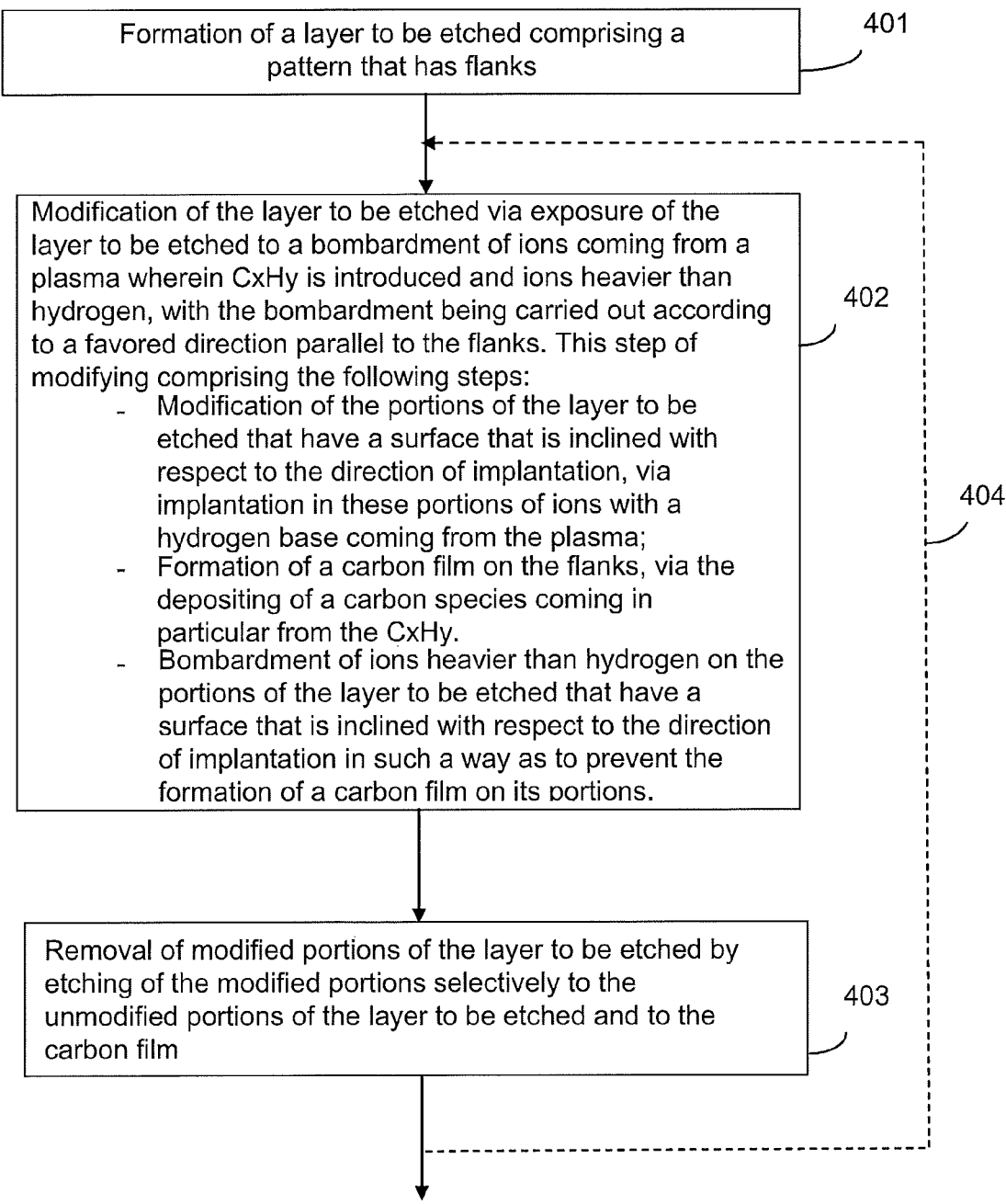
FIG. 4 shows the main steps of modifying the layer to be etched and its selective removal with respect to the unmodified layer.

FIG. 4 summarizes the main step 401 to 403 of a detailed example of a method for etching patterns according to the invention. Details on the steps 401 to 403 shall be respectively given in the paragraphs hereinbelow relating to FIGS. 5a to 5c.

Figure 5A:
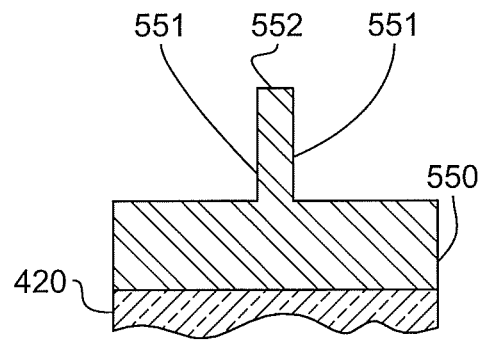
FIGS. 5a to 5c shows another example of the method according to the invention in which the pattern is protruding.

FIG. 5a shows a structure obtained after the step of forming 401 a layer to be etched 550 having a pattern. The pattern has flanks 551. In the figures these flanks 551 extend vertically. In this example the pattern 551 forms a protruding relief and has a top 552. In the example of 8 the pattern forms a cavity or a trench.

For reasons of clarity, the underlying layers of the layer to be etched are not shown in this figure. The presence of these layers is shown by an underlying layer or substrate 420. It is understood that in practice many layers can be provided under the layer to be etched 450. According to the applications, it is possible for example to provide a support substrate, a layer wherein the patterns of the layer to be etched have to be transferred, etc.

The layer to be etched 550 can comprise or be constituted of one or a combination of the following materials. These materials apply to all of the embodiments of this invention, not only to the embodiment of FIG. 5:

nitride (N) and/or silicon (Si) and/or carbon (C). The layer to be etched preferably has a dielectric constant less than or equal to 8 and preferably less than 7. The layer to be etched 550 is for example a layer of silicon nitride (SiN) of which the dielectric constant is equal to 7.

In a preferred but not limiting manner, the layer to be etched 550 comprises a material that has a low dielectric constant less than 4 and preferably less than 3.1 and preferably less than or equal to 2. For example, the materials such as SiCO, SiC, SiCN, SiOCN, SiCBN, SiOCH, c-BN, boron nitride (BN) and SiO2, are qualified as "low-k" materials, i.e. with a low dielectric constant. The material of the layer to be etched 550 taken from the "low-k" materials such as hereinabove makes it possible as such to reduce the parasite capacity in order to improve the performance of the transistor.

The invention is however not limited to the examples of materials such as hereinabove. The layer to be etched 550 can be of another material that has a low dielectric constant less than or equal to 8 and preferably less than 7.

According to an embodiment, the layer to be etched 550 is a porous layer.

Alternatively, the layer to be etched 550 is a non-porous layer.

Preferably, the material of the layer to be etched 550 is compatible with dry or wet cleaning carried out in a following step 403 in order to remove modified portions of the layer to be etched (step described later).

All of the semi-conductor materials including silicon (Si), germanium (Ge), silicon germanium (SiGe) and all of the composite semi-conductors of the III-V and II-VI type obtained by combining, respectively, two elements, or more, of columns II and III on the one hand, and V and VI on the other hand, of the periodic table of the elements. This is for example gallium arsenide or AsGa.

All of the oxides and nitrides of the semi-conductor materials hereinabove.

All of the metals and their alloys in particular those commonly used by the microelectronics industry including: titanium (Ti) and titanium nitride (TiN), tantalum (Ta) and tantalum nitride (TaN), copper (Cu), platinum (Pt), All materials containing silicon (Si) such as silicon oxynitride (SiON).

All metal oxides and in particular: hafnium oxide (HfO2), lanthanum oxide (LaO), titanium dioxide and monoxide (TiO2 and TiO), zirconium oxide (ZrO2).

Boron-doped carbon (B:C).

The thickness of the layer to be etched 550 is preferably sufficiently large, so that after the carrying out of the steps of modifying 402 and of removing 403, there remains unmodified portions 452 of the layer to be etched 550 on the flanks 551 of the pattern.

In a preferred embodiment, the thickness of the layer to be etched 550 is between 5 nm and 30 nm, preferably 10 nm.

Preferentially but only optionally, the method of the invention comprises an optional step of reducing the dielectric constant of the layer to be etched 550. According to an advantageous embodiment, the reduction of the dielectric constant is obtained during the step of depositing of the layer to be etched 550.

According to an embodiment, the reduction in the dielectric constant comprises the introduction into the layer to be etched 550 in formation of precursors that form bonds reducing the polarizability of the layer 152. When the layer to be etched is formed of or comprises silicon nitride SiN, these precursors are chosen in such a way as to form bonds that are less polar that the silicon nitride, such as Si—F, SiOF, Si—O, C—C, C—H, and Si—CH3.

According to another embodiment, alternative or combinable with the previous one, the reduction in the dielectric constant comprises the introduction into the layer to be etched 550 in formation of a porosity.

Figure 5B:
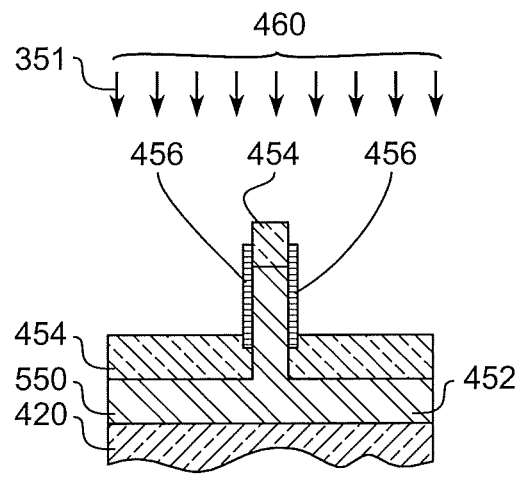

FIG. 5b shows the structure of the transistor 200 after the step of modifying 402 of the layer to be etched 550 and of forming a carbon film 456.

The step of modifying 402 the layer to be etched 550 such as formed at the end of the step 401, is done by putting the layer to be etched 550 into presence with a plasma comprising ions that are heavier than hydrogen and CxHy where x is the proportion of carbon and y is the proportion of hydrogen and of ions heavier than hydrogen, in order to form a modified layer to be etched 454 and a carbon film 456.

As such, the species of the plasma fulfill at least three functions. These three functions shall be explained in detail in the description hereinbelow.

"a" deposition of a protective layer formed of the carbon film 456, on the flanks 551 of the pattern;

"b" prevent the forming of the carbon film 456 on the surfaces perpendicular to the flanks 551 of the pattern;

"c" modification of the layer to be etched 550 in all of its thickness or over a larger thickness on the inclined surfaces with respect to the favored direction 351 of implantation, of which in particular on the surfaces perpendicular to the flanks 551 of the pattern. Possibly, according to the thickness of the carbon film 456, modification of the layer to be etched 550 to a lesser degree on the flanks 551 of the pattern. Preferably, the layer to be etched 550 located on the top 552 of the patter and on either side of the pattern is entirely modified while the layer to be etched 550 located on the flanks 551 of the patter is not modified or modified over a low thickness.

CxHy is introduced into the plasma, for example methane (CH4), in order to carry out the functions "a" and "c". The chemical species of the plasma containing carbon coming from the CH4 or more generally CxHy provide the function "a". In order to fulfill the function "b", the plasma comprises ions heavier than hydrogen such as helium (He), argon (Ar), nitrogen (N2), xenon (Xe) and oxygen (O2). With a concern for concision, these ions are designated in rest of the description as "heavy ions".

The function "c" is ensured by ions with a hydrogen base. Ions with a hydrogen base are preferably taken from: H, $H^+$, $H_2^+$, $H_3^+$. In the rest of the description, and with a concern for concision, these ions with a hydrogen base will be designated as "hydrogen ions". These ions have for property to easily penetrate and in depth into the layer to be etched 550. They as such modify the layer to be etched 550 but without pulverizing it. The heavy ions penetrate much less deeply into the layer to be etched 550. These heavy ions remain located on the surface and are therefore not able to modify a substantial thickness, and a fortiori all of the thickness, of the layer to be etched 550. The depth of penetration of the heavy ions is about ten times less than the depth of penetration of the hydrogen ions.

More precisely, the ions with a hydrogen base can be implanted in a material to be etched, without provoking a dislocation of its atomic structure such that it would result in a pulverization of the latter, and therefore without a re-depositing of the material etched on the walls of the reactor or the patterns during the etching itself, can be suitable.

An additional function is provided by the heavy ions. This additional functions consists in dissociating the molecule CxHy in order to release the species H. The helium (He) is particularly effective in providing this function. This mixture introduced into the plasma reactor as such preferably comprises a CxHy/He mixture.

Note here that this step of modifying 402 of the layer to be etched can be practiced in many different ways by adapting all sorts of means currently used in the microelectronics industry. In particular, standard etchings are used of which low or high density plasmas can be developed and wherein the energy of the ions can be controlled in order to allow for the implantation of the light species hereinbelow intended to modify the layer to be etched. A type of plasma referred to as immersion that is commonly used to carry out an implantation of species on the surface of a device being manufactured can also be used.

A modification of the layer carried out though an implantation using a plasma has the advantage of allowing for a continuous implantation from the free surface of the layer to be etched 550 and over a low thickness, typically between 0 and 100 nm even between 0 and 30 nm. It also makes it possible to benefit from improved selectivity from the beginning of the etching and from a constant etching speed, resulting in improved etching precision.

The use of a plasma in order to implant the layer to be etched 550 as such makes it possible to remove a very thin layer, typically between 1 and 10 nm and more generally between 1 and 30 nm.

This step of modifying 402 is carried out so that the plasma is anisotropic in such a way as to bombard the ions in a favored direction 351 parallel to the flanks 551 of the pattern. The plasma used during this step 402 creates a bombardment of ions with a hydrogen (H) base coming from the molecule of CxHy and being implanted in an upper portion of the thickness of the layer to be etched 550 on the flanks 551 of the pattern. These ions with a hydrogen base come from the CxHy of which the molecule is dissociated by the ions that are heavier than the hydrogen of the plasma.

As such the ions modify the surfaces perpendicular to the direction 351 of bombardment over a thickness that is more substantial than the surfaces parallel to the direction of bombardment. As such the upper portion of the thickness of the layer to be etched 550 on the flanks 551 of the pattern is modified over a lesser thickness than the surface at the top 552 of the pattern and the surfaces of the layer to be etched 550 covering the layers 420 that are underlying to it. An unmodified thickness 452 of the layer to be etched 550 covering the flanks 551 of the pattern is retained and will form the final pattern.

As such the ions with a hydrogen base penetrate into the layer to be etched 550 in order to modify it. At the same time, the CxHy, preferably CH4, of the plasma tends to deposition a carbon film 456 on the various walls.

The bombardment of ions heavier than hydrogen makes it possible for the carbon species coming from the CxHy to form the carbon film 456, in particular on the surfaces parallel to the direction of the bombardment, while still preventing a carbon film 456 from forming on the surfaces of the layer to be etched 550 which are perpendicular to the direction 351 of the bombardment, such as the surfaces located on either side of the patterns (FIGS. 5, 6, 8) or in the bottom of the hollows or trenches (FIG. 7). Indeed, the heavy ions of the plasma pulverize the carbon species coming from the CxHy that would tend to form on these walls perpendicular to the direction of implantation and therefore prevent the growth of this carbon film 456 on these walls perpendicular to the direction of implantation.

On the other hand, on the surfaces that receive a lesser bombardment or that do not receive any bombardment, this carbon film 456 is formed. As such, it is formed normally on the surfaces parallel to the direction 351 of the bombardment.

Note that particularly advantageously, the carbon film 456 acts as a protective carbon layer for the layer to be etched 550 that it covers, reducing the thickness on which the hydrogen ions penetrate into the layer to be etched 550 and modifies the latter. As such, the carbon film 456 makes it possible to increase the difference in thickness of modification between the surfaces covered by the carbon film 456 and the surfaces that are not covered by it. The thickness etched is as such even better controlled. As shall be indicated in what follows, another particularly advantageous function of this carbon film is that it protects the layer to be etched during the step of removing.

During said step of modifying the layer to be etched, the concentration in CxHy in the plasma is preferably between 2% and 50% of the total flow rate and preferably between 8% and 40%. Beyond this, it will be in deposition mode. The dilution will depend on the choice of the species of the heavy ions of the plasma, He, N2, Ar or O2 etc.

For example:
for He or Ar the flow rate of the CxHy has to be less than 10% of the total flow rate;
for N2 the flow rate of the CxHy has to be less than 20% of the total flow rate;
for O2 the flow rate of the CxHy has to be less than 50% of the total flow rate.

During the step of modifying the layer to be etched, the concentration in ions heavier than hydrogen in the plasma is between 50% and 98%. These concentrations are usually measured by a flow rate ratio in sccm.

In this patent application a ratio between two gaseous components is a ratio concerning the respective flow rates of the introduction of the components into the plasma reactor. Each flow rate is usually measured in sccm. Typically a flow rate is measured with a flow meter associated to the reactor.

In an embodiment using a He/CH4 plasma preferably in the form of a mixture, the layer to be etched 550 is modified by the ions H coming from the CH4 gas. The He ions destroy or prevent the formation of the carbon film 456 which would tend to be formed on the surfaces perpendicular to the direction 351 such that the surfaces of the modified layer to be etched 454 cover the underlying layers 420 such as for example a substrate or a functional layer.

In another embodiment using a H2/CH4/Ar plasma, in addition to hydrogen ions, the nature of the Argon ions and the parameters of the plasma, in particular its energy, make it possible to ensure a depletion of the methyl groups of the carbon film 456 carried out anisotropically, in such a way that the carbon film 456 is not formed on the surfaces perpendicular to the direction 351 such as hereinabove.

As such, the argon makes it possible to prevent, possibly by itself, also the formation of the carbon film on the surfaces perpendicular to the direction 351 of bombardment. Combined with He, N2, Xe and/or O2 it contributes to pulverizing the carbon film 456 that would tend to be formed.

As such, the heavy ions Ar, He, N2, Xe or O2 make it possible to reinforce the action of the ions with a hydrogen base by also preventing the formation of the carbon film 456 on the surfaces perpendicular to the main direction 351 of the bombardment.

Note that in all of these embodiments, the H ions of the CH4 participate in synergy with the heavy ions of the plasma (He, Ar, N2, Xe or O2 for example) in the modifying of the portion 454 of the layer to be etched 550, even if the depth of penetration of these heavy ions is less than that of ions with a hydrogen base.

As such, at the end of the step of modifying 402, the carbon film 456 formed covers only the surfaces of the layer to be etched 550 which are perpendicular or highly inclined with respect to the plane of the substrate 140, such as the flanks 551 of the pattern whether it is in relief as in FIG. 5 or in hollow as in FIG. 8.

Note here that the step of modifying 402 can be practiced in many different ways by adapting all sorts of means commonly used by the microelectronics industry, such as with the assistance of any etcher, for example in an ICP reactor "Inductively Coupled Plasma), or in a reactor of the CCP type (Capacitive Coupled Plasma) which makes it possible to control the energy of the ions. A type of plasma referred to as immersion that is commonly used to carry out an implantation of species on the surface of a device being manufactured can also be used.

In order to choose the implantation parameters those skilled in the art, in order to determine the behavior of the material to be etched in the type of implanter chosen, will preferably carry out beforehand "full plate" tests in order to establish the behavior curves. They will deduce from this the implantation parameters, in particular the energy and the dose of ions, i.e. the exposure time, to be used in order to reach the desired thickness of the material to be modified.

As an example, the table hereinafter gives the typical conditions for implementing the step of modifying 402 of the layer to be etched 550, carried out by the use of a plasma of He/CH4, of H2/CH4/Ar, of CH4/Ar, of CH4/N2, or of CH4/N2/H2, according to the time in seconds and the polarization power (bias) in watts, etc. These conditions largely depend on the thickness to be modified of the layer to be etched 550.

In an example hereinbelow, the layer to be etched 550 is a layer with a nitride base such as a layer of silicon nitride.

| | |
|---|---|
| Etching reactor: | ICP or CCP reactor or via immersion He/CH4 plasma (He: 50-500 sccm, CH4: 5-15 sccm), or H2/CH4/Ar or H2/CH4/N2 plasma (H2: 50-500 sccm, CH4: 5-15 sccm, Ar (Argon) or N2: 100-1000 sccm) |
| Thickness of the layer to be etched 550 to be modified (thickness of the modified layer to be etched 454): | 1-a few tens of nm, for example 6-10 nm |
| Power of the source: | 0-2000 Watts |
| Polarization power (energy of the ions): | 20-500 V |
| Pressure: | 5 milli Torr-10 milli Torr |
| Temperature: | 10-100° C. |
| Time: | a few seconds to several hundred seconds |

A more precise example of the implementation of the step of modifying 402 making it possible to modify a thickness of 17 nm of nitride, carried out by the use of a He/CH4 plasma, is described in the table hereinbelow:

| | |
|---|---|
| Etching reactor: | He/CH4 plasma (He: 250 sccm, CH4: 10 sccm) |
| Thickness of the layer with a nitride base 152 to be modified (thickness of the modified layer 454 with a nitride base): | 17 nm |
| Power of the source: | 500 W |
| Polarization power (energy of the ions): | 250 V |
| Pressure: | 10 milli Torr |
| Temperature: | 60° C. |
| Time: | 60 seconds |

Another more precise example of the implementation of the step of modifying 402 making it possible to modify a thickness of 15 nm of SiCBO by the use of a He/CH4 plasma, is described in the table hereinbelow:

| | |
|---|---|
| Etching reactor: | He/CH4 plasma (He: 250 sccm, CH4: 10 sccm) |
| Thickness of the layer to be etched | 15 nm |

-continued

| 550 to be modified (SiCBO): | |
| --- | --- |
| Power of the source: | 500 W |
| Polarization power (energy of the ions): | 250 V |
| Pressure: | 10 milli Torr |
| Temperature: | 60° C. |
| Time: | 60 seconds |

According to an embodiment not shown in FIG. 5 but shown in FIG. 8, the layer to be etched 550 is modified over its entire thickness over the top 552 of the patterns and outside of the patterns and while still leaving in place unmodified portions 452 of the layer to be etched 550 on the flanks 551 of the pattern.

Figure 5C:
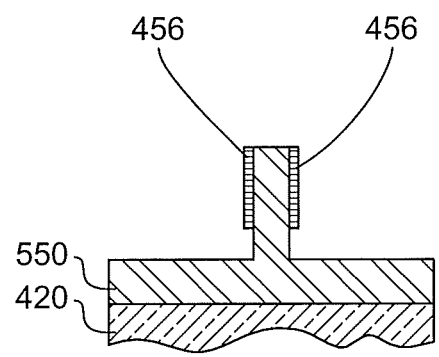

FIG. 5c shows the result of the step of removing 403 of modified portions 454 of the layer to be etched 550 after having been carried out an operation of selective etching of the modified layer to be etched 454 with respect to the carbon film 456. Preferably, this etching is also selective with regards the unmodified portions 452 of the layer to be etched 550.

In the case where all of the thickness of the layer to be etched 550 is modified outside of the flanks, this etching is entirely selective with regards to the layer 420 directly underlying the layer to be etched.

The etching solutions as such etches the modified layer to be etched 454 to which it directly has access on the top 552 of the pattern and on either side of the pattern.

In the case where the ions with a hydrogen base are not implanted in the layer to be etched located on the flanks 551 of the pattern, which can be the case if the carbon film 456 is thick enough, the layer to be etched located on the flanks 551 of the pattern is not modified or is modified only very little. During the step of removing 403, the etching solution therefore does not remove the layer to be etched 550 located on the flanks 551. The carbon film 456 therefore remains maintained by the latter. It therefore does not disappear during the step of removing. This embodiment is shown in FIGS. 5 to 8.

Alternatively, in the case where the ions with a hydrogen base are implanted in the layer to be etched located on the flanks 551 of the pattern, which can be the case if the carbon film 456 is thin, a thickness of the layer to be etched located on the flanks 551 of the pattern is therefore modified.

During the step of removing, according to the shape of the structure, the etching solution can be introduced also into the space located on the flanks 551 of the pattern, between the carbon film 456 covering the flanks 551 and the unmodified portions 452. In this space, occupied by the modified layer to be etched 454 obtained at the end of the step of modifying 402, the etching solution consumes the modified layer to be etched 454.

In this case, the carbon film 456 is no longer supported and disappears. Typically this disintegration of the carbon film is qualified as a "lift off".

Advantageously, the parameters of the step of removing are also configured in such a way that the modified layer to be etched 454 can be selectively etched with respect to the layer made with an oxide typically an oxide of said semi-conductor material, with the latter forming for example a hard mask. Such a hard mask is shown in FIG. 7 and bears the reference 560. Typically, the selective etching of the modified layer to be etched 454 does not consume the silicon oxide SiO2.

Advantageously, these parameters are also configured in such a way that the modified layer to be etched 454 can be selectively etched with respect to a semi-conductor material of a layer 420 directly underlying the layer to be etched 550.

Preferably, the step of removing 403 is carried out by wet etching by using an etching solution with a hydrofluoric acid (HF) base.

In an embodiment in which the modified layer to be etched 454 is typically a layer with a nitride base, the step of removing 403 can be carried out by wet etching by using an etching solution with a hydrofluoric acid (HF) base or with a phosphoric acid (H3PO4) base for a layer to be etched of SiCN for example.

It is advantageous that the etching of the modified layer to be etched 454 be as selective as possible with respect to the silicon if the underlying layer 420 to the layer to be etched 550 is made of silicon. For example, in this embodiment of wet etching, there is no consumption of silicon due to the use of the etching solution with a hydrofluoric acid (HF) base.

As mentioned hereinabove, the thickness of the modified layer to be etched 454 is typically between a range of values from 1 nm to several tens of nm. The etching times can range from a few seconds to a few minutes by obviously depending directly on the thickness that was modified.

As an example, in order to remove a modified thickness between 5 nm and 20 nm of modified nitride, about 30 seconds are needed with a 1% hydrofluoric acid (HF) solution. The sale etching time is obtained with phosphoric acid (H3PO4) diluted to 85% for a layer of silicon nitride SiN.

A solution of hydrofluoric acid (HF) can be used for layers to be etched with a base of materials other than nitride, silicon and carbon.

For example, in order to remove a modified thickness of 15 nm of modified SiCBO, about 30 seconds are needed with a 1% hydrofluoric acid (HF) solution.

The stopping of said selective etching can therefore be done on the unmodified portions 452 of the layer to be etched 550 or/and on the underlying layer 420 for example made of monocrystalline silicon or/and on the hard mask 560 at the top 552 of the pattern, until the disappearance of the modified layer to be etched 454.

For the removal of the modified layer to be etched 454, recourse is preferably given to a wet etching that combines the removal of the modified layer to be etched 454 with a wet cleaning of the wafer, containing the devices during manufacture, because after this wet etching, conventionally a wet cleaning is carried out in order to clean a wafer on which the transistor 200 is.

Preferably, this wet etching is combined with the wet cleaning, which simplified the method and saves time.

The wet cleaning parameters are also configured in such a way that the modified layer to be etched 454 can be etched very selectively with respect to the species containing carbon of the carbon film 456 and to the unmodified portions 452 of the layer to be etched 550.

Alternatively to a wet etching, a dry etching of the modified layer to be etched 454 selectively to the material of the underlying layer 420, made for example with silicon, to the unmodified material of the layer to be etched and to the material of a possible hard mask 560, for example made of silicon oxide (SiO2), can then also be practiced for this step of dry removing 403 of the modified layer to be etched 454.

Figure 9:
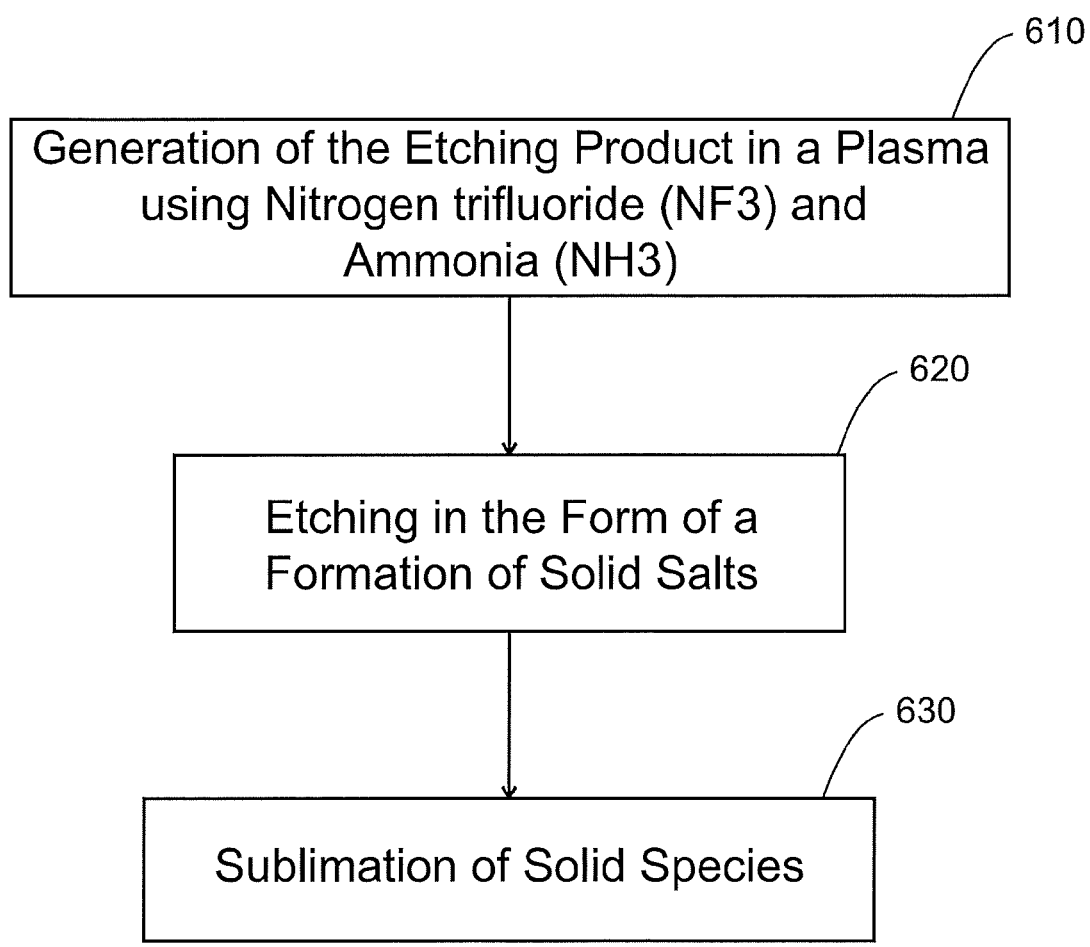
FIG. 9 shows the steps of dry removing of the modified layer to be etched.

The principle of the dry removing of the modified portions 454 of the layer to be etched 550 typically with a nitride base, for example of SiN, SiCO or SiOCN, comprises the following steps 610 to 630 shown in FIG. 9 that are carried out in a reaction chamber wherein a plasma is formed. The thicknesses treated are typically between 1 nm and a few tens of nanometers.

The method is that described by H. Nishini and his co-authors in a publication entitled "Damage-free selective etching of Si native oxides using NH3/NF3 and SF6/H2O down flow etching" published in the "Journal of Applied Physics" volume 74 (2), in July 1993.

The principle of dry removing of the modified layer to be etched 454 is close to that described in the publication hereinabove. The difference is that in the case of the invention silicon oxide is not etched but the modified layer to be etched 454 through the use of a plasma of the H2/CH4/Ar type for example.

The mechanism is however the same and comprises the following steps that are carried out in a reaction chamber where a plasma is formed. A first step 610 consists in generating the etching product in the plasma according to the following chemical reaction:

$$NF_3+NH_3 \rightarrow NH_4F+NH_4F.HF$$

which causes the nitrogen trifluoride ($NF_3$) to react with the ammonia ($NH_3$).

The etching is carried out during a second step 620, at a temperature of about 30° C. and more generally between 10° C. and 50C, in the form of a formation of salts according to the following chemical reaction:

$$NH_4F \text{ or } NH_4F.HF+SiNH \rightarrow (NH_4)2SiFe_6(\text{solid})+H_2$$

During an operation which lasts between a few seconds and a few minutes and which is carried out under a pressure between a few milli Torr and a few Torr. More precisely, this operation lasts between 20 seconds and 2 minutes and is carried out under a pressure between 500 milli Torr and a 3 Torr.

The solid species that are formed during this operation are then sublimated 630 at a temperature above 100° C. for several tens of seconds according to the following reaction:

$$(NH_4)2SiFe(\text{solid}) \rightarrow SiF_4(g)+NH_3(g)+HF(g)$$

For example, to remove 10 nm of modified nitride 454 the flows of nitrogen trifluoride ($NF_3$) and of ammonia ($NH_3$) are respectively 50 sccm and 300 sccm at 30° C. for 45 seconds for the step 620 of forming salts which is followed by the step of sublimation 630 which is carried out at 180° C. for 60 seconds.

This embodiment makes it possible to obtain very good selectivity of the etching of the modified portions 454 of the layer to be etched 550 with respect to the unmodified portions 452 and to the material of the underlying layer 420. In particular, this selectivity of the etching is much higher (typically by a factor of 10 at least) to that obtained with an HF solution.

At the end of the step of removing 403, there remains only unmodified portions 452 of the initial protective layer 152 primarily on the flanks 551 of the pattern.

The result of FIG. 5c can be the result of a single step of modifying 402 and of a single step of removing 403 or of a plurality of sequences comprising these steps. Indeed, the operations of modifying 402 the layer to be etched 550 and of removing 403 the modified layer to be etched 454 can optionally be repeated 404 as shown in FIG. 4. According to a non-limiting embodiment, such as the one shown in FIG. 8 for example, the sequences each comprise a step of modifying 402 and a step of removing 403 are carried out until the complete removal of the layer to be etched 454 outside of the flanks 551 of the pattern. The number of sequences is calculated according to the etching speed of the first sequence.

At the end of the step 403 of removing, a pattern is as such obtained of which the aspect ratio is higher than at the beginning of the method.

Additional steps can for example be standard steps where a transfer is carried out of the pattern obtained as such in an underlying layer.

Other embodiments shall now be described in reference to FIGS. 6, 7 and 8.

Figure 6A:
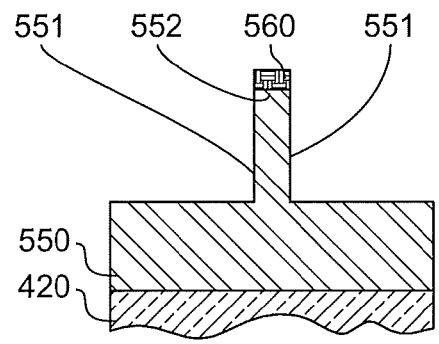
FIGS. 6a to 6c shows another example of the method according to the invention in which the pattern is protruding and overmounted with a masking block.
Figure 6B:
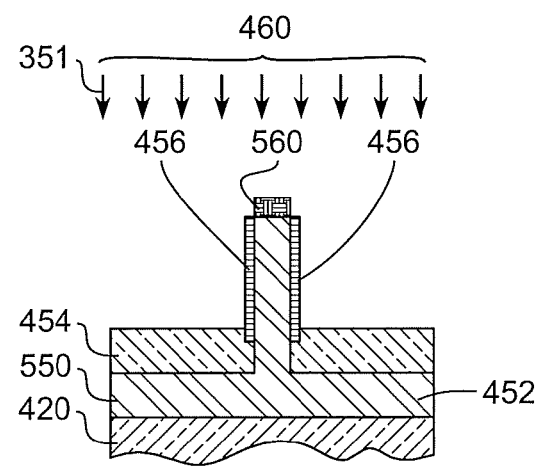
Figure 6C:
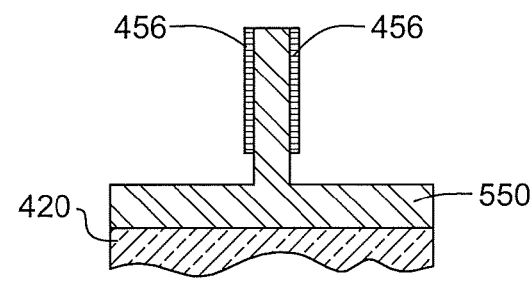

FIG. 6, comprised of FIGS. 6a to 6c, shows an embodiment close to that of FIG. 5.

It differs from it in that the pattern of the layer to be etched 550 is overmounted with a making block 560, also designated as a mask. This masking block is located on the top 552 of the pattern after the step of forming 401 of the pattern.

The steps 402 and 403 of modifying the layer to be etched 550 and of removing modified portions 454 of the layer to be etched are identical to those described in reference to FIG. 5 except that the implantation 460 is carried out through the mask 560 and possibly the step of removing 403 is also carried out through the mask 560.

The material and the thickness of the masking block 560 as well as the step of removing 403 are carried out in such a way that the masking block 560, either prevents the modification of the top 552 of the pattern by the ions with a hydrogen base during the step of modifying 402, or prevents the etching of the modified material that it covers during the step of removing 403, or provides both of these functions. Preferably the step of removing 403 is selective of the material of the mask. This is not required if the thickness of the mask 560 is sufficient to prevent the top of the pattern from being etched if it was modified during the implantation 460.

As such, the top 552 of the pattern is not consumed during the step of removing 403. This makes it possible to have at the end of the method an aspect ratio that is higher than at the beginning of the method. Indeed, the layer to be etched 550 is etched on either side of the pattern without etching its top and while still retaining very good dimensional control of the width of the pattern and of the verticality of the flanks 551, by the protection conferred by the carbon film. The dimensional control is therefore retained while still improving the aspect ratio.

The invention as such makes it possible to improve the precision of the of the manufacture of the patterns via a reliable, simple and very precise method.

As with each one of the embodiments of the invention, it can be chosen to retain the carbon film 456 at the end of the method or on the contrary to remove it.

In this latter case, the following steps are preferably carried out: the carbon film 456 can be removed by a plasma (without bombardment) that is reducing (with a hydrogen base) or that is oxidizing (with an O2 base).

Advantageously, this method of removing the carbon film 456 does not damage the surface condition of the flanks and makes it possible to retain good dimensional control of the pattern.

FIG. 7 comprised of FIGS. 7a to 7f shows an embodiment wherein the pattern formed in the layer to be etched at the end of the step 401 is in hollow. This can be a trench, a hole or any other shape.

Figure 7A:
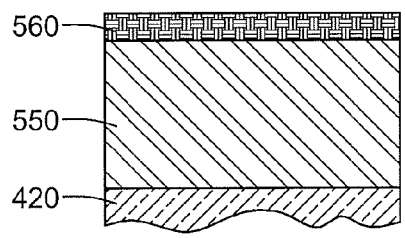
FIGS. 7a to 7f shows another example of the method according to the invention in which the pattern is a hollow.
Figure 7B:
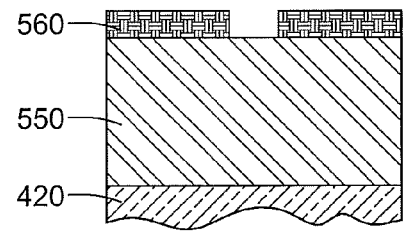
Figure 7C:
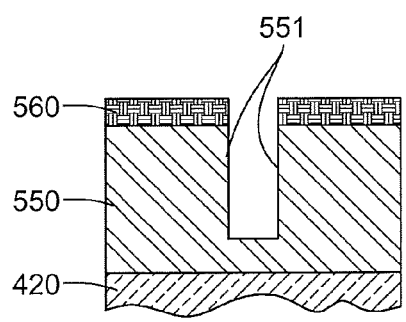

FIGS. 7a to 7c show the step 401 of forming the pattern in a hollow. FIG. 7a shows the starting stack: one or several underlying layers 420, the layer to be etched 550 and a masking layer 560.

In FIG. 7b, a pattern is defined in the masking layer 560. For example, this masking layer 560 is a layer of resin that is opened in order to form a pattern.

In FIG. 7c, the pattern of the masking layer 560 is transferred into the layer to be etched 550 by conventional methods. At the end of FIG. 7c, a layer to be etched 550 is as such obtained comprising a pattern in a hollow that has flanks 551 and a bottom 553.

Figure 7D:
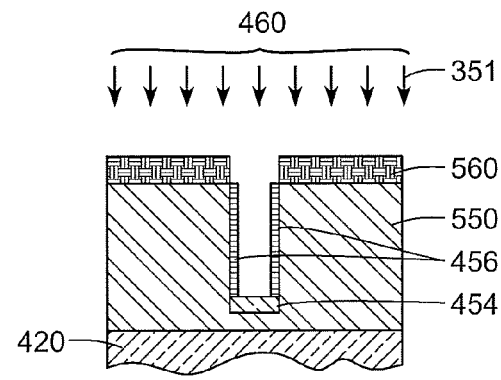
Figure 7E:
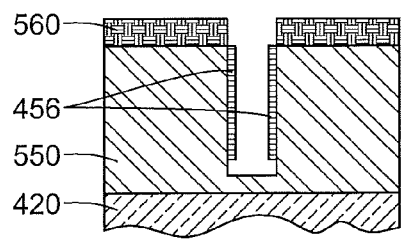
Figure 7F:
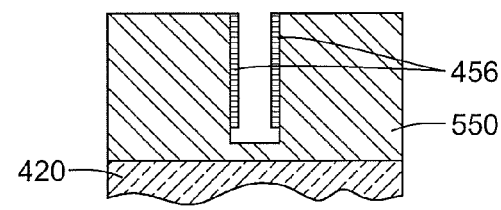

The step of modification 402 is shown in FIG. 7d. Preferably, during the step of modifying 402, the masking layer 560 can be retained. As such, as in the embodiment of FIG. 6, the implantation is carried out through the mask 560. This can make it possible to not modify the upper surface of the masking layer 560 in order to increase the aspect ratio. Indeed, only the bottom 553 of the patterns will then be modified and will then be removed during the step of removal 403. For this the masking layer 560 preferably has a thickness greater than the maximum depth of implantation of the ions with a hydrogen base during the step of modifying 402.

Alternatively, the masking layer 560 is removed before the step of modifying 402. In this case, the plasma implantation modifies the upper portion of the layer to be etched 550 in order to define modified portions 454 on either side of the bottom of the pattern.

In these two embodiments, the bottom 553 of the pattern is modified by the implantation in depth of ions with a hydrogen base and the flanks 551 of the pattern are covered with carbon film 456.

The step of removing 403 is shown in FIG. 7d. During this step, the modified portions 454 of the layer to be etched 550, in the example shown only the bottom of the pattern in a hollow, are removed.

The flanks 551 protected by the carbon film 456 are themselves not etched or are etched to a much lesser degree.

The step 7f consists in removing the masking layer 560 if this was not carried out in a prior step.

FIG. 8, comprised of FIGS. 8a to 8e, describes the steps of a plasma etching method according to the invention that makes it possible to overcome, at least partially, the disadvantages of the conventional etching methods mentioned in the chapter on the state of the art for the etching of patterns of very small dimensions.

Figure 8A:
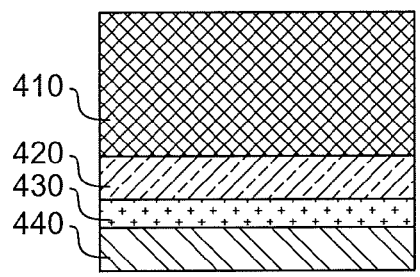
FIG. 8, comprised of FIGS. 8a to 8e, shows the steps of an example of the method of etching according to the invention.

FIG. 8a is a cross-section view of a device during manufacture after the depositing of a layer 410 of a material from which patterns of decananometric size are going to be formed in particular by the so-called SADP technique which makes it possible to exceed the limits of conventional photolithography such as can be practiced in a production line. The SADP technique was briefly described in the preceding paragraphs.

Generally, the layer 410 is deposited on the functional layer to be etched 420, for example made of silicon, which itself rests most often on an insulating layer 430 for example made of silicon dioxide (SiO2). These materials are not limiting and many other materials can be used. The whole is supported by a substrate 440 in particular intended for ensuring the mechanical rigidity of the unit and allow for the manipulation of wafers of devices during manufacture.

Figure 8B:
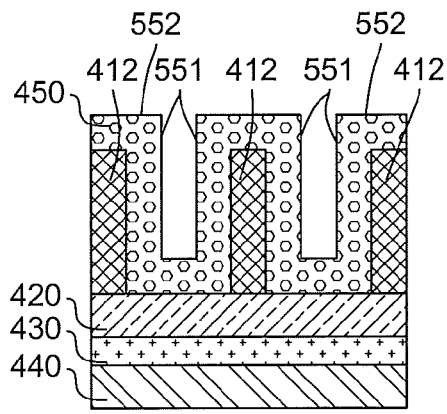

The layer 410 from which the patterns or reliefs 412 are going to be defined by conventional photolithography, as shown in FIG. 8b, is preferably for this type of application a material known as "SOC" (spin-on carbon). It designates a type of material deposited via centrifugation or "spin coating" with a carbon base in particular in the form referred to as "fulleren" comprised of molecules of large size that can have a geometric form that suggests in particular that of a sphere or of a football. A shape referred to as C60 is for example comprised of 12 pentagons and 20 hexagons, with each top corresponding to a carbon atom and each side to a covalent bond.

The method comprises a step of carrying out, for example by conventional photolithography, of reliefs 412, preferably in the carbon layer 410.

At least some reliefs 412 have a top 554 and are delimited by two flanks that extend from either side of the top 554 and which each extend from the underlying layer 420 to the top 554. The reliefs 412 having flanks parallel to the favored direction of implantation of the step of modifying 402.

We then move to the step 401 of forming of the layer to be etched 550 that has patterns. This step 401 comprises the depositing of the layer to be etched 550 that forms, in this embodiment, a covering layer or "liner" of a material that will constitute the patterns of flanks of the SADP technique that allows for a doubling of the density of the patterns obtained initially via lithography such as described in the state of the art.

This step of forming 401 of the layer to be etched 550, of a thickness preferentially substantially constant, is carried out in such a way as to cover the patterns 412, i.e. over all of the surfaces, vertical and horizontal, of the reliefs 412 already formed. This is as such a deposition that can be qualified as conformal. In a preferred but not limiting manner, the layer to be etched 550 is arranged directly in contact with the flanks and the tops 554 of the reliefs 412. Preferably, the layer to be etched 550 also covers the zone located between two reliefs 412.

This step of forming 401, is carried out preferably but not in a limiting manner using a method of depositing called LPCVD (low pressure chemical vapor deposition). This type of depositing which is practiced under atmospheric pressure indeed makes a uniform deposition it possible on all of the surfaces regardless of their orientation.

In alternative embodiments which shall be described in detail in what follows, this liner shall be designated in a more generic manner as the layer to be etched 550.

Note here that in the general framework of the invention a very wide range of materials constituting the line 550 can be used according to the applications. The materials that can be used for this layer with the method of the invention all comprise the materials mentioned hereinabove in reference to FIGS. 4 and 5.

The layer 550 is deposited in a range of thicknesses ranging typically from 5 nanometers to several tens of nanometers. For the carrying out of structures of smaller size, the layer deposited will be particularly within a range of thicknesses ranging from 5 to 10 nanometers.

Figure 8C:
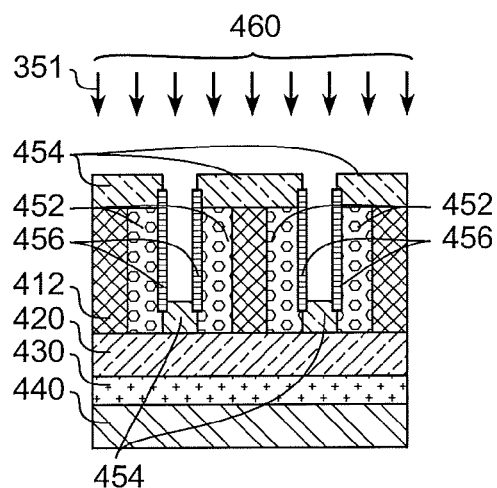
Figure 8D:
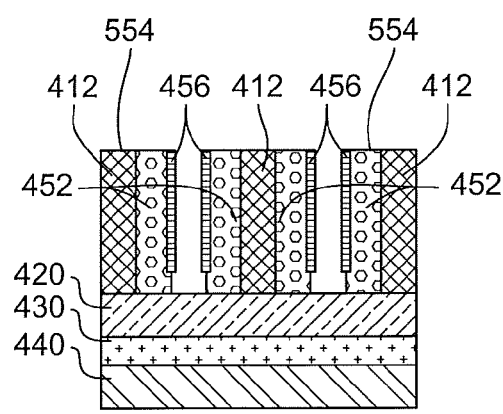
Figure 8E:
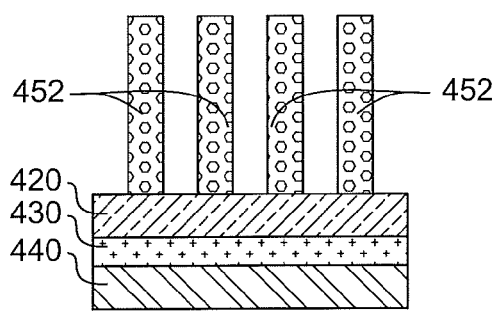

Such as shown in FIGS. 8c to 8e, we then proceed with a partial removal of the layer to be etched or liner by retaining at least partially on the flanks 551 in order to constitute a hard mask (HM) for the etching of the functional underlying layer 420 as shown in FIG. 8e.

As shown in FIG. 4, this sequence of steps of forming patterns of flanks 452 is done itself in two steps 402, 403, possibly repetitive. During a first step 402 we proceed with a modification of the material to be etched, i.e. with a modification of the layer 550.

The second step 403 consists in proceeding with the removal or the selective removal of the modified portions 454 with respect to unmodified portions 452 of the layer 550 and/or the other underlying layers.

The step of modifying 510 of the material to be etched consists in implanting therein via plasma ions with a hydrogen base. The conditions of the plasma, in particular the energy of the ions, are such that these ions are implanted in the layer to be etched 550 without provoking any dislocation of its atomic structure such that it would result in a pulverization of the latter.

The step of modifying 402 is practiced preferably from any type of plasma etching equipment, including:

- etchers of the ICP type (inductive coupled plasma), a device in which the radiofrequency field intended to form the plasma is produced by an antenna external to the chamber,
- plasma etchers referred to as immersion of the capacitive coupled plasma (CCP) type wherein a continuous or highly pulsed voltage is applied between two electrodes. The target to be implanted is placed on one of the electrodes, generally the cathode, and is therefore polarized negatively.

As indicated hereinabove, the modification of the layer carried out using a plasma has for advantage to allow for a continuous implantation of the species implanted from the free surface of the layer to be etched on a thickness typically between 1 and 10 nanometers. Another advantage is that the step of modifying 402, and the following step 403 of selective removing of the layer to be etched, can then optionally be practiced in the same enclosure.

As shown in FIG. 8c, the use of a directional plasma allows the modification of the layer to be etched to take place advantageously very anisotropically. As the flow of ions to be implanted 460 is oriented perpendicularly to the wafer starting from which the devices are manufactured, the modified zones 454 are primarily those that are parallel to the horizontal plan that constitutes the wafer and its substrate 440 in the representation of this figure.

Preferably for this embodiment and as shown in FIG. 8c, the step of modifying 402 is carried out in such a way as to modify the layer to be etched 550 over its entire thickness. As such outside of the surfaces parallel to the direction of implantation 351, the modified portions 454 extend from the surface of the layer 550 and to the underlying layer 420.

The use of a plasma comprising a gaseous mixture of the hydrocarbon type constituted of atoms of carbon (C) and of hydrogen (H) of formula CxHy where x and y are integers allows very advantageously for the formation on the flanks of the patterns, i.e. on all of the surfaces parallel to the flow of the ions bombarding the wafer on the surface of which the devices are being manufactured, of the carbon film 456 forming a protective layer. This carbon protective layer plays two roles: of the one hand it prevents or reduces, as soon as it begins to form, the modification of the layer 550 on the flanks during for example here the step of implantation 510. On the other hand it will also serve as protection, in the step 520, during the selective removal of the modified zones, significantly contributing to the obtaining of ideally desired forms for the SADP double patterns.

The presence of ions that are heavier than hydrogen (Ar, N2, Xe, O2 etc.) in the plasma makes it possible to pulverize the carbon film that would otherwise form also on the surfaces parallel to the plane of the wafer and of the substrate 440. The result is that shown in FIG. 8c where the zones 454 of the material constituting the layer to be etched 550 are modified via implantation while a carbon film 456 is deposited solely on the flanks of the patterns, with the bombardment of the heavier ions of the plasma preventing the formation of the carbon film on the surfaces parallel to the plane of the wafer and of the substrate 440.

The entire thickness of the layer to be etched 550 located on the top 554 of the reliefs 412 is modified, whether this is carried out in a single step or in several sequences with each one comprising a step of modifying and a step of removing.

The general conditions for implementing such a plasma for modifying the liner 550, regardless of the material used for this layer, are summarized in the following table for example for etching a layer to be etched 550 forming a liner of silicon:

| | |
|---|---|
| Etching reactor (any ICP or CCP type): | CxHy/He plasma |
| He | 50 to 500 sccm |
| Ar | 100 to 1000 sccm |
| CH4 | 5 to 15 sscm |
| Thickness of the liner layer to be modified: | 1 to several tens of nm |
| Power of the source: | 0-2000 Watts |
| Polarization power (energy of the ions): | 20 to 500 Volts |
| Pressure: | 5 to 100 milli Torr |
| Temperature: | 10 to 100° C. |
| Time: | a few seconds to several hundred seconds | sccm: flow rate in standard cubic centimeters per minute in standard conditions.

Advantageously, the adding of hydrogen (H2) into the gaseous mixture of the plasma, with a flow rate between 50 and 500 sccm, favors the modification of the film in depth.

Advantageously, the adding of oxygen (O2) prevents the deposition of carbon while still continuing to improve the effects of the microloading.

Naturally, the conditions hereinabove (time, temperature, pressure, etc.) will be adapted according to the material and the thickness that is desired to be modified by implantation.

FIG. 8d shows the result of the etching of the zones of the modified liner 550 by implantation at the end of the latter, or single, step of removing 403 of the modified portions 454 selectively to the unmodified portions. As the modification of the layer 550 is carried out under the entire thickness of the latter on the surfaces that are inclined with respect to the direction of implantation 351, it is necessary that the removing of the modified portions 454 be carried out selectively with respect to the underlying layer 420.

The entire thickness of the layer to be etched 550 is removed on the top 554 of the reliefs 412. The top 554 of the reliefs 412 is therefore exposed which will make it subsequently possible to etch the reliefs 412 selectively to the unmodified portions of the layer to be etched 550.

Many methods can be used to carry out the step 403 of selective removal of the modified portions 454 with respect to the unmodified portions. In a non-limiting manner, the latter can be divided into two main categories that can be used regardless of the embodiment retained to implant the ions during the preceding step of modifying 402.

A first option consists in practicing a "Wet cleaning", which is done using acid solutions, in particular with a hydrofluoric acid (HF) base or with a phosphoric acid (H3PO4) base for silicon nitride. Although the modified and unmodified material are both etched by this type of acid solutions the modified material is much more sensitive to this type of attack. Solutions that are highly diluted, with a low concentration in acid, that very weakly attack the unmodified layer, are therefore preferably used, so as to be able to remove the modified film selectively to the unmodified material and, possibly, to the other layers. Note here that a wet cleaning is not limited to the use of the acid solutions hereinabove. Any type of solution that makes it possible to consume the modified material can be used. For example a standard cleaning bath referred to as SC1 (NH4OH/H2O2/H2O) makes it possible to etch a material such as titanium nitride (TiN). A strong dilution makes it possible to consume the TiN that was modified by implantation of hydrogen without consuming, or very weakly, the unmodified titanium nitride. Hydrogen chloride (HCl) or hydrochloric acid is also used.

The other cleaning option qualified as "dry cleaning" relies in particular on the method described hereinabove and shown in FIG. 9

Note here that the dry removal of the modified film is not limited to materials with a silicon base. By selecting gases other than fluorine and hydrogen used for the silicon it is possible to generate solid salts of other materials that can be sublimated as hereinabove.

Optionally, according to the thickness of the layer 550 to be etched, cycles each comprising at least one step of modifying 402 and the step of removing 403 hereinabove are repeated 404 as many times as necessary in order to completely etch the layer 550, or reach the desired etching depth, if this cannot be obtained in a single cycle.

The materials that van be etched during the steps 401, 402, 403 hereinabove, include all of those that have been mentioned hereinabove as being able to be deposited in order to constitute the layer 550 or liner.

FIG. 8e shows the final result, i.e. the obtaining of a hard mask 452 for the implementation of the SADP technique and which does not suffer from the defects described in the state of the art, i.e. a faceting of the upper surfaces and of the irregular etching depths due to the microloading. This is obtained after the removal of the reliefs 412 made of SOC or "spin-on carbon". This removal is facilitated by the fact of exposing the top 554 of the reliefs during the preceding step. This removal is for example carried out in a plasma with an oxygen O2 base. During this operation, the carbon film 456 is also removed.

The method of this invention makes it possible to very precisely control the dimension of the patterns while still overcoming or by reducing the problems detailed hereinabove, for example those linked to the "micro-loading" described hereinabove or more generally the problems generated by an incomplete etching between patterns between patterns when the density of patterns is high.

The invention is not limited to only the embodiments and examples described hereinabove, but extends to all the embodiments that fall within the scope of the claims.

The invention claimed is:

1. A method for etching a layer to be etched comprising at least one pattern having flanks, the method comprising:
    at least one step of modifying the layer to be etched by putting the layer to be etched into presence with a plasma into which $C_xH_y$ has been introduced, where x and y are positive integers representing a respective number of carbon (C) and hydrogen (H) atoms in a molecule of the $C_xH_y$, the plasma also comprising ions that are heavier than hydrogen, and conditions of the plasma including a concentration of $C_xH_y$, energy of the ions, and a main direction of implantation being chosen such that the at least one step of modifying comprises:
        bombarding the layer to be etched with hydrogen ions coming from the $C_xH_y$ in the plasma, the bombardment being anisotropic according to the main direction of implantation and being parallel to surfaces of said flanks, the bombardment modifying portions of the layer to be etched that are inclined with respect to said main direction of implantation and those that are perpendicular to said main direction while retaining unmodified portions of the layer to be etched covering the surfaces of said flanks,
        forming a carbon film on surfaces parallel to said main direction including said retained unmodified portions of the layer to be etched covering the surfaces of said flanks, where carbon in the carbon film is coming from the $C_xH_y$, and
        bombarding the layer to be etched with ions that are heavier than hydrogen, which prevents the $C_xH_y$ from forming the carbon film on the surfaces of the layer to be etched that are inclined with respect to said main direction of implantation and on those that are perpendicular to said main direction; and
    at least one step of removing the modified layer to be etched by selective etching of the modified portions of the layer to be etched with respect to the carbon film.

2. The method according to claim 1, wherein the at least one step of removing the modified layer to be etched is carried out so as to be selective of the modified portions of the layer to be etched with respect to the unmodified portions of the layer to be etched.

3. The method according to claim 1, wherein during the at least one step of modifying of the layer to be etched, the concentration of $C_xH_y$ in the plasma is between 2% and 50%.

4. The method according to claim 1, wherein during the at least one step of modifying the layer to be etched, a concentration of ions heavier than hydrogen in the plasma is between 50% and 98%.

5. The method according to claim 1, wherein the at least one pattern is a protruding pattern that has at least one top.

6. The method according to claim 5, further comprising, prior to the at least one step of modifying:
    a step of forming protruding reliefs that have a top and flanks parallel to said main direction of implantation and each extending from an underlying layer in relief and to the top; and
    a step of forming the layer to be etched by deposition, including conformal deposition, on said reliefs such that the layer to be etched covers the top of the reliefs and a zone located between two reliefs.

7. The method according to claim 6,
    wherein the at least one step of modifying modifies the layer to be etched over an entire thickness thereof on the top of the reliefs and in the zone located between two reliefs, and
    wherein the at least one step of removing removes all of the modified portions of the layer to be etched, thereby exposing the top of the reliefs.

8. The method according to claim 5, further comprising, prior to the at least one step of modifying, a step of forming a mask covering at least the at least one top of the layer to be etched and leaving exposed the layer to be etched on either side of the pattern, wherein during the at least one step of modifying only the portions of the layer to be etched located on either side of the pattern are modified.

9. The method according to claim 1,
    wherein the at least one pattern is a pattern in a hollow that has at least one bottom and walls forming the flanks,
    wherein the method further comprises, prior to the at least one step of modifying, a step of forming a mask that covers the layer to be etched at least partially outside of the pattern and leaves exposed the at least one bottom of the pattern, and wherein, during the at least one step of modifying, only portions of the layer to be etched located in the at least one bottom of the pattern are modified.

10. The method according to claim 1, wherein the $C_xH_y$ is $CH_4$.

11. The method according to claim 1, wherein the ions that are heavier than hydrogen are taken from argon, helium, nitrogen, xenon, and oxygen.

12. The method according to claim 1, wherein the bombardment of the ions heavier than hydrogen is anisotropic according to the main direction of implementation and parallel to the surfaces of the flanks, the anisotropic bombardment preventing the $C_xH_y$ from forming the carbon film on surfaces that are perpendicular to the surfaces of the flanks.

13. The method according to claim 1,
wherein the layer to be etched is disposed directly, at least partially, on an underlying layer, and
wherein the at least one step of removing the modified portions of the layer to be etched is performing by etching selectively relative to the underlying layer.

14. The method according to claim 1,
wherein the layer to be etched is disposed directly, at least partially, on an underlying layer,
wherein, during the at least one step of modifying, the conditions of the plasma are chosen such that an entire thickness of the layer to be etched is modified by implantation of the hydrogen ions on surfaces that are perpendicular to the main direction of implantation, and
wherein the at least one step of removing removes all of the modified portions of the layer to be etched, thereby exposing the underlying layer on the surfaces perpendicular to the main direction of implantation.

15. The method according to claim 1, further comprising several sequences each comprising the at least one step of modifying and the at least one step of removing, wherein during at least one of the steps of modifying, only a portion of a thickness of the layer to be etched is modified.

16. The method according to claim 15, further comprising repeating the sequences until of the modified portions of the layer to be etched are removed on all surfaces parallel to a plane of a substrate on which the layer to be etched is disposed.

17. The method according to claim 1, wherein the at least one step of modifying is a single step that modifies the layer to be etched in all of a thickness thereof over all surfaces parallel to a plane of a substrate on which the layer to be etched is disposed and that does not modify the layer to be etched in said all of a thickness thereof on surfaces perpendicular to said plane.

18. The method according to claim 1, wherein the at least one step of removing is performed by selective dry-etching of the modified portions of the layer to be etched with respect to said carbon film, with respect to unmodified portions of the layer to be etched, and with respect to an underlying layer on which the layer to be etched is disposed.

19. The method according to claim 1, wherein the at least one step of removing is performed by selective wet etching of the modified portions of the layer to be etched.

20. The method according to claim 1, wherein the layer to be etched is a porous layer.

21. The method according to claim 1, wherein the layer to be etched is chosen from: a layer with a nitride base, a layer of silicon nitride, a layer with a silicon base, a layer with a carbon base, SiCO, SiC, SiCN, SiOCN, SiCBN, SiOCH, CBN, BN, SiCBO, and $SiO_2$, an oxide of a semiconductor material, a nitride of a semiconductor material, a metal oxide, boron-doped carbon (B:C), a metal, and a metal alloy.

22. The method according to claim 1, wherein the layer to be etched comprises a material that has a dielectric constant less than or equal to one of the following values: 7, 4, 3.1, and 2.

23. The method according to claim 1, wherein during the at least one step of modifying of the layer to be etched, the concentration in $C_xH_y$ in the plasma is between 8% and 40%.

* * * * *

UNITED STATES PATENT AND TRADEMARK OFFICE
CERTIFICATE OF CORRECTION

PATENT NO. : 9,773,674 B2  Page 1 of 1
APPLICATION NO. : 15/185540
DATED : September 26, 2017
INVENTOR(S) : Nicolas Posseme It is certified that error appears in the above-identified patent and that said Letters Patent is hereby corrected as shown below:

On the Title Page

Item (73), the Assignee's information is incorrect. Item (73) should read:
-- (73) Assignee: COMMISSARIAT A L'ENERGIE ATOMIQUE ET AUX ENERGIES ALTERNATIVES, Paris (FR) --

Signed and Sealed this
Twenty-fourth Day of April, 2018

Andrei Iancu
*Director of the United States Patent and Trademark Office*